US006218074B1

(12) United States Patent
Dueber et al.

(10) Patent No.: US 6,218,074 B1
(45) Date of Patent: Apr. 17, 2001

(54) FLEXIBLE, FLAME-RETARDANT, AQUEOUS-PROCESSABLE PHOTOIMAGEABLE COMPOSITION FOR COATING FLEXIBLE PRINTED CIRCUITS

(75) Inventors: Thomas Eugene Dueber, Wilmington, DE (US); Yueh-Ling Lee, Columbus, OH (US); Frank Leonard Schadt, III, Wilmington, DE (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 09/358,212

(22) Filed: Jul. 21, 1999

Related U.S. Application Data

(63) Continuation-in-part of application No. 08/804,646, filed on Feb. 25, 1997, now abandoned.

(51) Int. Cl.[7] .............................. G03F 7/095; G03F 7/033
(52) U.S. Cl. .................... 430/273.1; 430/284.1; 430/907; 430/910; 430/277.1; 522/92; 522/95; 522/75; 522/76; 522/79; 522/74
(58) Field of Search .................... 430/907, 910, 430/284.1, 273.1; 522/92, 95, 75, 76, 79, 74

(56) References Cited

U.S. PATENT DOCUMENTS

| 4,195,997 | * | 4/1980 | Graham | 430/286.1 |
| 4,499,163 | * | 2/1985 | Ishimaru et al. | 430/284.1 X |
| 4,988,605 | * | 1/1991 | Kubota et al. | 430/284.1 X |
| 5,006,436 | * | 4/1991 | Hung et al. | 430/284.1 |
| 5,134,175 | * | 7/1992 | Lucey | 522/76 |
| 5,288,589 | * | 2/1994 | McKeever et al. | 430/262 |
| 5,536,620 | * | 7/1996 | Dueber et al. | 430/284.1 |

FOREIGN PATENT DOCUMENTS

0676669A1 * 10/1995 (EP) .

OTHER PUBLICATIONS

Hitachi Chemical CA 102:15128, Chemical Abstracts, Columbus, Ohio, vol. 102, English Abstract of Japanese Laid Open Application 59–100433, Printed Jun. 6, 1984.*

* cited by examiner

Primary Examiner—Cynthia Hamilton

(57) ABSTRACT

A flexible, flame-retardant, aqueous processable, photoimageable resin composition for forming a permanent, protective coating film for printed circuitry and a multilayer photoimageable element containing a layer of the photoimageable resin composition in combination with a low tack photoimageable resin sublayer and a temporary support film are disclosed. The photoimageable resin composition has excellent aqueous developability and provides a cured coating film having good flexibility, adhesion, solvent resistance, surface hardness, thermal resistance, electrical insulating properties and flame retardancy.

48 Claims, No Drawings

FLEXIBLE, FLAME-RETARDANT, AQUEOUS-PROCESSABLE PHOTOIMAGEABLE COMPOSITION FOR COATING FLEXIBLE PRINTED CIRCUITS

This is a continuation-in-part of application Ser. No. 08/804,646 filed Feb. 25, 1997, now abandoned.

BACKGROUND OF THE INVENTION

The present invention relates to a flexible, flame-retardant, aqueous processable, photoimageable resin composition and a photoimageable element that is flexible after processing and cure. More specifically, the invention relates to a flexible, flame-retardant, aqueous processable, photoimageable resin composition for forming a permanent, protective coating film having excellent properties which can be used for the protection of printed circuitry during its lifetime, and to a multilayer photoimageable element comprising a layer of said composition in combination with a low tack photoimageable resin sublayer and a temporary support film.

The flame-retardant photoimageable resin composition has excellent aqueous developability and yields a cured coating film having good flexibility, ;adhesion, solvent resistance, surface hardness, thermal resistance, electrical insulating properties and Underwriters Laboratory 94VTM-0 flame retardency on flexible polyimide laminates that contain active flame retardants in the adhesive layer, e.g., Pyralux® FR and Teclam® (commercially available from E. I. du Pont de Nemours and Company) and on adhesiveless polyimide laminates. The photoimageable resin composition is suitable for use as a solder resist in the fabrication of printed circuit boards.

DESCRIPTION OF THE PRIOR ART

Photopolymerizable resist materials are known, for example, from U.S. Pat. Nos. 3,469,982 and 3,547,730, which describe a film resist with a sandwich structure in the form of a photopolymerizable layer between a cover sheet and a temporary support. Such a primary film resist can, for instance, be laminated on a copper base, exposed imagewise and developed with organic solvents or aqueous solutions, whereby a defined resist layer is formed. Typically the copper base for a printed circuit board is rigid, with limited flexibility of just a few degrees, such as the conventional copper-clad fiberglass epoxy laminates. More recently, printed circuits are being prepared on highly flexible film substrates to form electronic packages which may be folded and refolded one or more times to fit a specified configuration or a dynamic mechanical operation.

The defined resist layer thus produced can now be selectively etched, electroplated or treated with solder on the substrate. Particularly high demands are placed on photoresist films if they are used as permanent coatings that function as solder resists or masks. In this case, the developed, photopolymerized layer must withstand temperatures up to 300° C. without degradation, loss of adhesion or accumulation of residues contained in or on the molten solder. With the advanced technology of today's printed circuit boards, it is important to have the capability to photoimage a solder mask. According to the current state of the art, such solder masks can be applied by spraying, coating or calendaring liquid compositions on a substrate or also by laminating a dry film on a substrate.

Due to the general adverse environmental impact of organic solvents, aqueous developable photopolymer systems with fast development are now preferred. The use of photopolymer resists with acid functions, primarily carboxyl functions, is known to impart aqueous processability. However, these groups are disadvantageous in many subsequent steps or events. In the case of primary photoresists, delamination of the resist is observed in alkali etching or gold plating and, in the case of solder masks, inadequate environ-mental resistance can occur. Modification of the carboxyl groups with melamine formaldehyde compounds to overcome the named disadvantages is known (EP 01 15 354 and U.S. Pat. No. 4,247,621).

The utilization of polymers containing carboxylic acid groups that are subsequently converted to less reactive and less moisture sensitive species is also known. U.S. Pat. No. 4,987,054 discloses a photo-polymerizable formulation yielding improved properties containing an acid copolymeric binder wherein a copolymer structural unit is the half acid/amide of a dicarboxylic acid. The disclosed formulations are used with conventional rigid printed circuit boards, processed with wholly aqueous alkaline solutions and are storage stable. European Patent Application EP 430,175 discloses a photopolymeric system similar to U.S. Pat. No. 4,987,054.

International Patent Application WO 93/17368 and U.S. Pat. No. 5,536,620 disclose an aqueous processable, photoimageable, permanent coating composition for printed circuits comprising (a) a cobinder consisting of a low molecular weight amic acid copolymer and a high molecular weight carboxylic acid-containing copolymer, (b) an acrylated urethane monomer component, (c) a photoinitiator system, and (d) a melamine formaldehyde thermal crosslinking agent.

U.S. Pat. No. 5,288,589 discloses a two layer photoimageable, aqueous processable photoresist containing an amphoteric binder in the layer laminated directly to a printed circuit board thereby providing a permanent coating with improved adhesion throughout the lamination process while maintaining other desirable properties such as storage stability and circuit encapsulation.

However, none of the above-mentioned prior art photoimageable compositions have a sufficient degree of flame retardency.

As the electronic industry is driven towards faster, more reliable and compact devices, there is an increasing need in the printed circuit field for a more flexible, permanent photoimageable coating that can withstand typical manufacturing process conditions, such as molten solder, and which additionally meets established government flammability standards.

SUMMARY OF THE INVENTION

The present invention relates to a flame-retardant, aqueous-processable photoimageable resin composition suitable for forming a flexible permanent, protective coating on a flexible printed circuit board comprising:

(a) a brominated carboxylic copolymer binder formed from (i) a ring-brominated aromatic monomer, (ii) at least one of an alkyl acrylate, allyl methacrylate or non-brominated aromatic monomer, wherein alkyl contains from 1 to 20 carbon atoms, and (iii) an ethylenically unsaturated carboxylic acid monomer said binder having a weight average molecular weight ($M_w$) of from 40,000 to 500,000 and containing from 3 to 40% bromine by weight;

(b) a non-brominated low molecular weight copolymer binder having a weight average molecular weight ($M_w$) of from 2,000 to 10,000, which is the reaction product of a primary amine with a copolymer formed from at least one ethylenically unsaturated dicarboxylic acid anhydride and at least one ethylenically unsaturated comonomer and containing at least one structural unit A and at least one additional structural unit selected from $B_1$, $B_2$, and combinations thereof containing carboxyl groups, wherein:

(i) 5 to 50 percent by weight of said low molecular weight copolymer binder is formed from at least one structural unit $B_1$, $B_2$ or combination thereof containing carboxyl groups, (ii) 50 to 95 percent by weight of said low molecular weight copolymer binder is formed from structural unit A, wherein A, is different from structural units $B_1$ and $B_2$, (iii) A, $B_1$ and $B_2$ have the structures:

A.

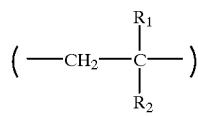

$B_1$.

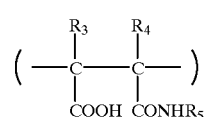

$B_2$.

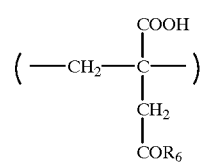

wherein $R_1$ is H, alkyl or aryl; $R_2$ is H, $CH_3$, aryl, $-COOR_7$, $-CONR_8R_9$ or $-CN$; $R_3$ and $R_4$ independently are H or alkyl; $R_5$ is alkyl, aryl or aryl which is substituted with primary amino, secondary amino, tertiary amino, hydroxy or ether groups or mixtures thereof; $R_6$ is $-OH$ or $NHR_5$; and $R_7$, $R_8$ and $R_9$ independently are H, alkyl, aryl or aryl substituted with one or more hydroxy, ester, keto, ether or thioether groups; wherein alkyl in any of the above R groups contains from 1 to 6 carbon atoms;

(c) an acrylated urethane monomeric component containing from 0 to 20% bromine by weight;

(d) a brominated acrylated monomer containing from 10 to 80% bromine by weight with the proviso that (d) is not a urethane monomeric component;

(e) a brominated additive containing from 10 to 85% bromine by weight with the proviso that (e) is not an acrylated monomeric component or a blocked polyisocyanate crosslinking agent;

(f) a photoinitiator or a photoinitiator system; and (g) a blocked polyisocyanate crosslinking agent containing from 0 to 30% bromine by weight, wherein the total content of bromine in the composition is in a range from 5 to 50% by weight, and further wherein when the composition is applied to a substrate with circuit lines, cured at a temperature greater than 100° C. for one hour, the cured composition is capable of being bent and creased at an angle 90° to the circuit lines without the formation of cracks or delaminations.

In another aspect, the present invention relates to a flexible, flame-retardant, multilayer, photoimageable permanent coating element capable of adhering to a printed circuit board and withstanding molten solder after cure, comprising:

(1) a temporary support film;

(2) a first layer of a photoimageable permanent coating composition comprising;

(a') an amphoteric binder;

(b') a carboxyl group containing copolymer binder of the formula

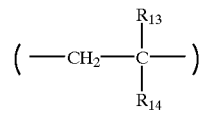

wherein $R_{13}$ is H or $C_{1-4}$ alkyl; $R_{14}$ is phenyl or $-CO_2R_{15}$; and $R_{15}$ is H or $C_{1-4}$ alkyl which can be substituted with one or more hydroxy groups;

(c') a monomer component containing at least two ethylenically unsaturated groups; and (d') a photoinitiator or photoinitiator system;

(3) a second layer of a photoimageable permanent coating composition comprising:

(a) a brominated carboxylic copolymer binder formed from (i) a ring-brominated aromatic monomer, (ii) at least one of an alkyl acrylate, alkyl methacrylate or non-brominated aromatic monomer, wherein alkyl contains from 1 to 20 carbon atoms, and (iii) an ethylenically unsaturated carboxylic acid monomer, said binder having a weight average molecular weight ($M_W$) of from 40,000 to 500,000 and containing from 3 to 40% bromine by weight;

(b) a non-brominated low molecular weight copolymer binder having a weight average molecular weight ($M_W$) of from 2,000 to 10,000, which is the reaction product of a primary amine with a copolymer formed from at least one ethylenically unsaturated dicarboxylic acid anhydride and at least one ethylenically unsaturated comonomer and containing at least one structural unit A and at least one additional structural unit $B_1$ and $B_2$ containing carboxyl groups, wherein:

(i) 5 to 50 percent by weight of said low molecular weight copolymer binder is formed from at least one structural unit $B_1$, $B_2$ or combination thereof containing carboxyl groups, (ii) 50 to 95 percent by weight of said low molecular weight copolymer binder is formed from structural unit A, wherein A is different from structural units $B_1$ an $B_2$, (iii) A, $B_1$ and $B_2$ have the structures:

A.

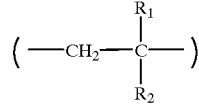

$B_1$.

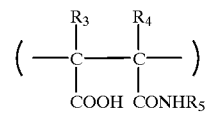

-continued

B2.

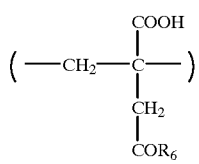

wherein $R_1$ is H, alkyl or aryl; $R_2$ is H, $CH_3$, aryl, —$COOR_7$, —$CONR_8R_9$ or —CN; $R_3$ and $R_4$ independently are H or alkyl; $R_5$ is alkyl, aryl or aryl which is substituted with primary amino, secondary amino, tertiary amino, hydroxy or ether groups or mixtures thereof; $R_6$ is —OH or $NHR_5$; and $R_7$, $R_8$ and $R_9$ independently are H, alkyl, aryl or aryl substituted with one or more hydroxy, ester, keto, ether or thioether groups; wherein alkyl in any of the above R groups contains from 1 to 6 carbon atoms;

(c) an acrylated urethane monomeric component containing from 0 to 20% bromine by weight;

(d) a brominated acrylated monomer containing from 10 to 80% bromine by weight with the proviso that (d) is not a urethane monomeric component;

(e) a brominated additive containing from 10 to 85% bromine by weight with the proviso that (e) is not an acrylated monomeric component or a blocked polyisocyanate crosslinking agent;

(f) a photoinitiator or a photoinitiator system; and (g) a blocked polyisocyanate crosslinking agent containing from 0 to 30% bromine by weight, wherein the total content of bromine in the second layer composition is in a range from 5 to 50% by weight, and further wherein when the composition is applied to a substrate with circuit lines, cured at a temperature greater than 100° C. for one hour, the cured composition is capable of being bent and creased at an angle 90° to the circuit lines without the formation of cracks or delaminations.

DETAILED DESCRIPTION OF THE INVENTION

Typical rigid printed circuit board materials are made of epoxy resin and glass fiber. The epoxy resin may also be brominated so that the rigid substrate is actually flame-retardant, enabling it to meet industry specifications for flammability. Rigid substrates generally have a thickness in the range of 15–65 mils (0.38–1.7 mm) and form a large proportion of the mass of the printed circuit board. By contrast, flexible substrates for printed circuit materials generally have a thickness of 10 mils (0.25 mm) or less. Even though the substrate material may not itself burn, such as polyimide film, the thin substrate does not contribute the ballasting and/or flame-retardant effects of the thick rigid substrate. Although thin layers of flame retardant adhesive can be applied to the thin substrate material on one or both sides, the effects on flammability are still substantially less than those for thick rigid substrates. Therefore, it is much more difficult to achieve a desirable flammability rating on a thin flexible substrate, than on a thick rigid substrate.

To obtain a photoimageable resin composition for coating printed circuits that provides flame-retardancy for flexible printed circuit materials, it is not possible to simply add flame retardant materials to the resin composition without considering the other necessary properties. In addition to being flame-retardant, the coating formed from the resin composition must also be flexible so that the printed circuit material can be bent and shaped as desired, and increasingly, it is desirable for the coating to be aqueous-processable. Other properties, such as tack, chemical resistance and pencil hardness must also be maintained within acceptable limits.

It has been found that flame-retardancy, flexibility and aqueous-processability can be achieved while maintaining other essential properties, by combining three types of flame-retardant components in the photoimageable composition: (1) a brominated carboxylic copolymer binder; (2) a brominated acrylated monomer; and (3) a brominated additive.

It was found that acceptable flame-retardance could not be achieved by the use of brominated binders alone. The brominated binders generally have lower amounts of bromine per unit weight than other brominated ingredients of this invention, since binders with high bromine content generally have lower solubility in coating solvents and develop less well in aqueous developers. Thus it is not possible to add enough binder for flame retardance without sacrificing other essential properties.

It was found that acceptable flame-retardance could not be achieved by the use of brominated additives alone. The additives are generally not expected to participate in the imaging step which involves photopolymerization. Therefore, they are not involved in reactions which result in increasing the molecular weight which is necessary to resist development. At the high levels necessary in order to provide adequate bromine content, the additives negatively affect development of high resolution images and other functional properties. Even the reactive additives are reacted during the cure step after development.

It was found that acceptable flame-retardance could not be achieved by the use of brominated monomers alone. At the high levels necessary in order to provide adequate bromine content, the compositions are too brittle after the exposure and curing steps.

It was also found that combinations of any two types of flame retardant components did not result in photoimageble compositions with acceptable properties. The addition of either brominated monomer alone or brominated additive alone to the brominated binder required such high levels of monomer or additive that the difficulties described above were experienced. Similarly, compositions including brominated monomer and brominated additive without the brominated binder required high levels of either monomer or additive, with the associated problems, in order to achieve flame-retardance. It was only in compositions in which all three types of bromine-containing materials were present that all the desired properties could be achieved.

The flame-retardant, photoimageable resin composition that constitutes one aspect of the present invention is composed of essential components (a) to (g) listed above which are further described hereinbelow. Unless otherwise stated, all percentages are by weight and refer to the percent of dry solids.

(a) Brominated Carboxylic Copolymer Binder

The flame-retardant, photoimageable resin composition contains from 10 to 60% by weight, preferably from 25 to 45% by weight, of a brominated carboxylic copolymer binder (a) which is the polymerized reaction product of (i) aromatic monomer units that are substituted on the aromatic ring with bromine and, preferably, an ethylenically unsaturated group, (ii) at least one of an allyl acrylate, alkyl methacrylate or non-brominated aromatic monomer units, and (iii) ethylenically unsaturated carboxylic acid monomer units. Proper selection of the respective monomers enables production of flame-retardant resin compositions useful in printed circuit applications. Representative of ring-brominated aromatic monomers are styrene, methylstyrene, alpha-methylstyrene, alpha-methyl methylstyrene, ethylstyrene or alpha-methyl ethylstyrene with bromine substitution (mono, di, tri, tetra and mixtures thereof) in the phenyl nucleus. Mixtures or mixed isomers of the above monomers may also be used. The preferred ring-brominated aromatic monomer is a brominated styrene, with dibromostyrene being most preferred.

The ring brominated aromatic monomer units are preferably present in an amount of from 5 to 55% by weight, preferably from 15 to 40% by weight, based on the weight of the copolymer, to provide from 3 to 40% bromine by weight, preferably from 5 to 30% bromine by weight, based on the weight of the copolymer. The brominated carboxylic acid copolymer component (a) provides the requisite flame-retardant properties and improved hardness and chemical resistance to the photoimageable resin composition.

Practical examples of the alkyl acrylate or alkyl methacrylate monomer unit are methyl acrylate, ethyl acrylate, n-propyl acrylate, isopropyl acrylate, n-butyl acrylate, isobutyl acrylate, n-amyl acrylate, n-hexyl acrylate, isohexyl acrylate, 2-ethylhexyl acrylate, n-heptyl acrylate, isoheptyl acrylate, 1-methyl-heptyl acrylate, n-octyl acrylate, 6-methylheptyl acrylate, n-nonyl acrylate, 3,5,5-trimethylacrylate, n-decyl acrylate, lauryl acrylate and the corresponding alkyl methacrylates and other primary, secondary and tertiary higher alkyl acrylates and methacrylates where the alkyl group can contain from 1 to 20, preferably from 2 to 10, carbon atoms. Practical examples of non-brominated aromatic monomers are styrene, methyl styrene, alpha-methylstyrene, alpha-methyl methylstyrene, ethylstyrene, alpha-methyl ethyl styrene, benzyl acrylate or benzyl methacrylate. The preferred monomers are ethyl acrylate, n-propyl acrylate, n-butyl acrylate, methyl methacrylate, and styrene. The alkyl (meth) acrylate monomer or non-brominated aromatic monomer is present in an amount of from 20 to 92% by weight, based on the weight of the copolymer, preferably from 40 to 75% by weight.

Practical examples of the ethylenically unsaturated monomer unit include acrylic acid, methacrylic acid, itaconic acid, maleic acid and fumaric acid. The preferred acids are acrylic and methacrylic acids. The unsaturated carboxylic acid monomer is present in an amount of from 3 to 25% by weight, preferably from 7 to 20% by weight, based on the weight of the copolymer.

A preferred brominated carboxylic copolymer is a copolymer of 25 weight % dibromostyrene, 59 weight % ethyl acrylate and 16 weight % acrylic acid having a weight average molecular weight ($M_W$) ranging from 40,000 to 500,000.

(b) Non-brominated Copolymer Binder

The non-brominated cobinder (b) is present in an amount of from 2 to 15% by weight, preferably from 3 to 10% by weight, based on the total weight of the photoimageable composition and comprises a low molecular weight copolymer binder formed from 50 to 95% by weight of at least one structural unit A and from 5 to 50% by weight of at least one additional structural unit B1, B2 or combination thereof containing carboxyl groups, wherein A, B1 and B2 have the structures:

A.

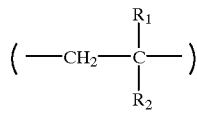

B1.

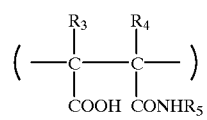

B2.

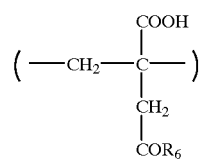

wherein $R_1$ is H, alkyl or aryl, preferably H or $CH_3$; $R_2$ is H, $CH_3$, aryl, —$COOR_7$, —$CONR_8R_9$ or —CN, preferably aryl, —$COOR_7$ or —$CONR_8R_9$; $R_3$ and $R_4$ independently are H or alkyl; $R_5$ is alkyl, aryl or aryl which is substituted with primary amino, secondary amino, tertiary amino, hydroxy or ether groups or mixtures thereof; $R_6$ is —OH or $NHR_5$; and $R_7$, $R_8$ and $R_9$ independently are H, alkyl, aryl or aryl substituted with one or more hydroxy, ester, keto, ether or thioether groups, preferably aryl or hydroxy substituted alkyl or aryl groups and wherein alkyl in any of the above R groups contains from 1 to 6 carbon atoms.

The proportion of structural unit A ranges from 50 to 95 percent by weight, preferably from 65 to 90 percent by weight, and the proportion of structural unit B1 and/or B2 ranges from 5 to 50 percent by weight, preferably from 10 to 35 percent by weight. It is understood that these percentages exclude the terminal portions of the binder.

The low molecular weight copolymer binder containing adjacent carboxyl and amide groups can be formed by direct copolymerization of one or more ethylenically unsaturated dicarboxylic acids, which, after dehydration, form structural units B1 and/or B2, with one or more comonomers which form structural unit A, followed by reaction of primary amines or anhydrous ammonia with the resultant copolymers that are formed by the copolymerization. Suitable ethylenically unsaturated dicarboxylic acid anhydrides which form structural units B1 and/or B2 are for example maleic acid anhydride, itaconic acid anhydride and citraconic acid anhydride. The proportion of ethylenically unsaturated dicarboxylic acid anhydrides in the copolymer binder ranges from 5 to 50 percent by weight, preferably from 10 to 35 percent by weight.

Primary aliphatic or aromatic, optionally substituted amines can be used. Substituents can be the following functional groups: primary amino, secondary amino, tertiary amino, hydroxy, ester, keto, ether and/or thioether groups. Propylamine, butylamine, octylamine, aminopropanol, aminoethanol, amino-phenol, 1,2-diaminoethane, 1,3-diaminopropane, 1,3-diaminopentane, N-methyl-1,2-diaminoethane, N-ethyl-1,2-diaminoethane, N,N-dimethyl-1,2-diaminoethane or N-(2-hydroxyethyl)-1,2-diaminoethane are preferred.

Suitable comonomers, which form the structural unit A of the copolymer binder, are styrene, substituted styrenes, and unsaturated carboxylic acids and their derivatives, such as, for example, (meth)acrylic acid, (meth)acrylic acid amides and (meth)acrylates. Methyl methacrylate, methyl acrylate, acrylamide, ethyl acrylate, butyl (meth)acrylate, and styrene are preferred.

The amic acid of the copolymer binder derived from the ethylenically unsaturated dicarboxylic acid anhydride has a weight average molecular weight ($M_w$) in the range of from 2,000 to 10,000, preferably from 3,000 to 6,000. The preferred molecular weight range can be influenced by the use of an aliphatic amine that contains primary, secondary or tertiary amino substitution which leads to lower solubility resins at the higher end of the molecular weight range.

When the permanent coating is photoprinted, development of the composition requires that the copolymer cobinder component (b) contains sufficient acidic or other groups to render the composition processable in aqueous alkaline developer. The coating layer formed from the composition is removed in portions which are not exposed to radiation but is substantially unaffected in exposed portions during development by aqueous alkaline liquids such as wholly aqueous solutions containing 1% sodium or potassium carbonate by weight for a time period of five minutes at a temperature of 40° C.

The cobinder component (b) helps achieve end-use properties, such as encapsulation of circuit patterns without air entrapment, fast development in aqueous carbonate developer, flexibility, adhesion, resistance to environmental conditions and resistance to alkali etching or plating solutions.

A particularly preferred non-brominated copolymer cobinder (b) comprises a copolymer of itaconic anhydride, itaconic acid, butyl acrylate, butyl methacrylate and styrene reacted with n-butylamine and having a weight average molecular weight ($M_w$) of 4,000 and which is present in an amount of from 2 to 15 weight %, preferably from 3 to 10 weight %, of the photo-imageable composition.

(c) Acrylated Urethane Monomeric Component

An acrylated urethane monomeric component (c) is an essential ingredient of the photoimageable composition, since it imparts increased flexibility to the cured layer and reduced brittleness, when used in the correct proportion with the other essential ingredients of the composition. It is known that many factors can influence the properties (e.g., glass transition temperature) and thus performance of urethane structures in a particular application. These factors include diisocyanate type, diol molecular weight, codiols (i.e. short chain diols), ratio of diol to codiol, as well as the amount of branching and molecular weight of the resultant polyurethane. Properties after acrylation will vary correspondingly. It is important to choose the proper acrylated urethane and amount of such relative to the other essential ingredients in order to obtain a proper balance of flexibility, toughness and chemical resistance in the permanent coating. The acrylated urethane is present in an amount of from 5 to 30% by weight, preferably from 8 to 20% by weight, and contains at least one acrylate or methacrylate group.

Preferred types of acrylated urethanes have the general formula:

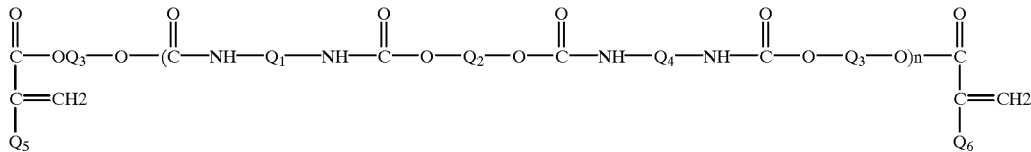

wherein $Q_1$ and $Q_4$ are aromatic groups which may be unsubstituted or substituted by lower alkyl groups and which can contain a lower alkylene group as a connecting member; $Q_2$ and $Q_3$ are independently polyoxyalkylene groups containing 1 to 10 carbon atoms; $Q_5$ and $Q_6$ are independently alkyl of 1 to 3 carbon atoms or H, and n is at least one.

Particularly preferred is a urethane diacrylate which is the reaction product of 2,6-toluene diisocyanate with a polyol with the end isocyanate groups end-capped with hydroxyethyl acrylate.

The (meth)acrylated urethane may also include di(meth) acrylates and tri(meth)acrylates which are carboxylated to provide acid numbers ranging from 1 to 50 or more and molecular weights ranging from 500 to 5000. Carboxylated urethane di(meth)acrylates and tri(meth)acrylates are particularly advantageous since they provide cleaner development in aqueous basic developer.

In order to increase flame-retardency of the photoimageable composition, acrylated urethanes containing one or more bromine atoms may be used to provide a bromine content of up to 20% bromine by weight. Examples of brominated urethane (meth)acrylates include reaction products of dibromoneopentyl glycol or the bis(2-hydroxyethylether) of tetrabromobisphenol-A with hexamethylene diisocyanate and end-capped with hydroxyethyl acrylate, or the reaction product of dibromoneopentyl glycol and polyols with aliphatic or aromatic diisocyanates and end-capped with hydroxyethyl acrylate.

(d) Brominated Acrylated Monomer

The photoimageable composition contains from 5 to 40% by weight, preferably from 10 to 30% by weight, based on the weight of the composition, of a brominated acrylated monomer (d) containing at least one (meth)acryloyloxy group and having a bromine content of from 10 to 80% bromine by weight.

Use of the bromine containing acrylated monomer containing not less than 10% by weight of bromine makes it possible to produce a flame-retardant photoimageable resin composition having excellent alkaline developability, yielding a cured coating film having good adhesion, solvent resistance, thermal resistance, low residue after development and exhibiting excellent flame retardancy.

Specific examples of the bromine containing acrylated monomer (d) include bis-(3-methacryloyloxy-2-hydroxypropyl) ether of tetrabromobisphenol-A, bis-(3-acryloyloxy-2-hydroxypropyl)ether of tetrabromobisphenol-A, bis-(2-methacryloyloxyethyl)ether of tetrabromobisphenol-A, bis-(2-acryloyloxy-ethyl)ether of tetrabromobisphenol-A, 2-tribromo-phenoxyethyl methacrylate, 2-(2-tribromophenoxyethoxy)ethyl acrylate, tribromophenyl acrylate, pentabromobenzyl acrylate, pentabromobenzyl methacrylate, tribromoneopentyl acrylate, and the reaction products of diepoxy oligomers of tetrabromo-bisphenol-A and epichlorohydrin with acrylic or methacrylic acid followed by reaction of one or more hydroxyls per molecule with anhydrides such as succinic anhydride.

(e) Brominated Additive

The flame-retardant photoimageable resin composition contains from 1 to 40% by weight, preferably from 2 to 20% by weight, of a brominated additive(e) containing from 10 to 85% bromine by weight for imparting improved flame retardancy. The brominated additive (e) may be substantially non-reactive or, preferably, may be reactive during the thermal cure with one or more of the other components of the photoimageable composition. Such reactivity can provide a more fully cured matrix thereby enhancing end-use properties and preventing migration of additives within the cured matrix under accelerated or environmental conditioning.

Examples of reactive brominated additives include 3,4,5, 6-tetrabromo-1,2-benzene dicarboxylic acid mixed esters with diethylene glycol and propylene glycol or with diethylene glycol and ethylene glycol, diester/ether diol of tetrabromophthalic anhydride, bis-(2-hydroxyethyl)ether of tetrabromobisphenol-A, 2,2-bis-(bromomethyl)-3-bromo-1-propanol, 2,2-bis-(bromomethyl)-1,3-propanediol, di-(tribromophenolate) of tetrabromo-bisphenol-A diglycidyl ether and succinic esters thereof, tetrabromobisphenol-A, brominated poly(p-vinylphenol), and poly (dibromophenylene oxide).

Examples of substantially non-reactive brominated additives include di-2-ethylhexyl tetrabromophthalate and tris (dibromophenyl)phosphate.

From 0 to 40% by weight of a flame-retardant, brominated filler compound may also be added to the photoimageable composition to further enhance flame-retardant properties. The filler is generally a material of low solubility in the coating solvent. Examples of flame-retardant fillers include ethylene bis(tetrabromophthlimide), decabromodiphenyl oxide, bis(tribromophenoxy)ethane, poly (pentabromobenzyl acrylate) and the like.

(f) Photoinitiator System

The photoinitiator system (f) contains one or more initiator compounds that directly furnish free-radicals when activated by actinic radiation. The system also may contain a sensitizer that is activated by the actinic radiation, causing the initiator compound to furnish the free-radicals. The sensitizer may extend spectral response into the near ultraviolet, visible, and near infrared spectral regions.

The photoinitiator system comprises from 0.01 to 10% by weight, preferably from 0.01 to 5% by weight, of the photoimageable composition.

Numerous conventional photoinitiator systems are known to those skilled in the art and may be used herein provided they are compatible with the other ingredients of the coating composition. A large number of free-radical generating compounds, including redox systems such as Rose Bengal/ 2- dibutylaminothanol, may be selected to advantage. A useful discussion of dye sensitized photopolymerization can be found in "Dye Sensitized Photo-polymerization" by D. F. Eaton in Adv. in Photochemistry, Vol. 13, D. H. Volran, G. S. Hammond, and K. Gollinick, eds., Wiley-Interscience, New York, 1986, pp. 427–487.

Sensitizers useful with photoinitiators include methylene blue and those disclosed in U.S. Pat. Nos. 3,554,753; 3,563,750; 3,563,751; 3,647,467; 3,652,275; 4,162,167; 4,268,667; 4,351,893; 4,454,218; 4,535,052; and 4,565,769. A preferred group of sensitizers include the bis(p-dialkyl-aminobenzylidene) ketones disclosed in Baum et al, U.S. Pat. No. 3,652,275, and the arylidene aryl ketones disclosed in Dueber, U.S. Pat. No. 4,162,162.

Preferred photoinitiator systems are 2,4,5-triphenyl-imidazolyl dimers in combination with chain transfer agents, or hydrogen donors, such as are disclosed in U.S. Pat. Nos. 3,479,185; 3,784,557; 4,311,783; and 4,622,286. Preferred hexaaryl-biimidazoles (HABI) are 2-o-chlorosubstituted hexaphenyl-biimidazoles in which the other positions on the phenyl radicals are unsubstituted or substituted with chloro, methyl or methoxy. The most preferred initiator is o-Cl-HABI, i.e., 1,1'-biimidazole, 2,2'-bis(o-chlorophenyl)4,4',5, 5'-tetraphenyl-imidazole dimer.

Hydrogen donor compounds that function as chain transfer agents in the photopolymer compositions include: 2-mercapto-benzoxazole, 2-mercaptobenzo-thiazole, 4-methyl-4 H-1,2,4-triazole-3-thiol, etc.; as well as various types of compounds, e.g., (a) ethers, (b) esters, (c) alcohols, (d) compounds containing allylic or benzylic hydrogen, (e) acetals, (i) aldehydes, and (g) amides disclosed in column 12, lines 18 to 58 of MacLachlan U.S. Pat. No. 3,390,996. Suitable hydrogen donor compounds for use in systems containing both biimidazole type initiator and N-vinyl carbazole are 5-chloro-2-mercaptobenzothiazole; 2-mercaptobenzothiazole; 1 H-1,2,4-triazole-3-thiol; 6-ethoxy-2- mercaptobenzo-thiazole; 4-methyl4 H-1,2,4-triazole-3-thiol; 1-dodecanethiol; and mixtures thereof.

A particularly preferred class of photoinitiators and photosensitizers are benzophenone, Michler's ketone, ethyl Michler's ketone, pdialkylamino-benzaldehydes, p-dialkylaminobenzoate alkyl esters, polynuclear quinones, thioxanthones, hexaarylbiimidazoles, cyclohexadienones, benzoin, benzoin dialkyl ethers, or combinations thereof where alkyl contains 1 to 4 carbon atoms.

(g) Blocked Polyisocyanate Crosslinking Agent

The photoimageable compositions are generally applied to a substrate by lamination or from solution. In these processes, the composition is heated, for example, during the lamination operation or during evaporation of the solvent after application from solution. Partial crosslinking can take place in the unexposed areas even before photostructuring, which results in impairment of image quality. Thus, a desirable property of the photoimageable composition is that it undergoes as little crosslinking as possible due to this heat treatment. On the other hand, it is also desirable that the composition be cured rapidly and at moderate temperatures after application and imagewise exposure in order to obtain high throughput and simultaneous savings of energy costs.

According to the present invention, a thermally activated crosslinking agent is used which crosslinks with the reactive functional groups, such as hydroxyl, carboxyl, amide and amine groups which are present in the copolymer binder components and other ingredients in the photoimageable coating composition. The presence of the proper crosslink imparts the capability to withstand molten solder temperature and improves chemical resistance or other mechanical or chemical properties required in the end-use product.

The preferred crosslinking agent is a blocked polyisocyanate which has a cleavage temperature of at least 100° C., or a mixture of polyisocyanates of this type. In the context of this description, this is to be understood as meaning a blocked polyisocyanate in which at least half of the blocked isocyanate groups are deblocked at a temperature of at least 100° C. and are thereby available for reaction with the isocyanate-reactive functional groups of the other components of the photoimageable composition in the curing step. The compositions of the invention can be cured at a temperature greater than 100° C.

The polyisocyanate on which the blocked component is based may be any aliphatic, cycloaliphatic, aromatic or arylaliphatic compounds having at least two, preferably two to four, isocyanate groups and which may have further substituents which are inert to isocyanate groups, such as alkyl or alkoxy groups.

These include, for example, the following compounds: 2,4-diisocyanato-toluene, and technical grade mixtures thereof with 2,6-diisocyanatotoluene, 1,5-diisocyanatonaphftalene, 1,4-diisocyanatonaphthalene, 4,4'-diisocyanato-diphenymeffiane and technical grade mixtures of various diisocyanatodiphenyl-methanes (for example the 4,4'- and 2,4'-isomers), diisocyanato-m-xylylene, N,N'-di(4-methyl-3-isocyanato-phenyl)urea, 1,6-diisocyanatohexane, 1,12-diisocyanatododecane, 3,3,5-trimethyl-1-isocyanatomethylcyclo-hexane(isophorone diisocyanate), trimethyl-1,6-diisocyanatohexane, 1-methyl-2,4-diisocyanatocyclohexane, trisisocyanato-triphenyl-methane and 4,4'-diisocyanatodicyclo-hexylmethane.

The polyisocyanates may be blocked by various radicals. Examples of suitable blocking components are beta-dicarbonyl compounds, such as malonates, acetoacetates or 2,4-pentanedione, or hydroxamates, triazoles, imidazoles, tetrahydropyrimidines, lactams, oximes, ketoximes, low molecular weight alcohols, or phenols or thiophenols.

The blocked polyisocyanate may also be a urethanized, carbodiimidated, biuretized, or dimerized or trimerized polyisocyanate, a trimer containing an isocyanurate ring, a biscyclic urea compound, a polymeric isocyanate, a copolymer of two or more diisocyanates, or other forms of polyisocyanates which are inactive below 100° C., so long as their cleavage temperature is at least 100° C. Examples of these are urethanized 4,4'-diisocyanato-diphenylmethane, carbodiimidated 4,4'-diisocyanatodiphenylmethane, uretdione of 2,4-diisocyanato-toluene, the trimer of diisocyanatotoluene, N,N',N"-tri(6-isocyanatohexyl)-biuret, isophorone diisocyanate, trimeric hexane diisocyanates, trimeric dodecane diisocyanates, adipoyl bis(propylene urea), and azelaoyl bis(propylene urea).

Preferred blocked polyisocyanates have a cleavage temperature between 100° C. to 200° C. Particularly preferred herein are methylethyl ketoxime blocked 1,6-diisocyanatohexane trimers, methylethyl ketoxime blocked isophorone diisocyanate, and the reaction products of 1,6-diisocyanatohexane or trimer thereof with bis(2-hydroxyethylether) of tetrabromobisphenol-A blocked with methyl ethyl ketoxime and are present in an amount of from 2 to 20% by weight, preferably from 5 to 15% by weight, based on the weight of the photoimageable composition and containing up to 30% bromine by weight to improve flame-retardancy of the composition.

Compared with photoimageable compositions cured using melamine-formaldehyde crosslinking agents, the photoimageable coating compositions of the invention are distinguished, surprisingly, by higher elongation and better chemical resistance at lower cure temperature. In addition, the cured coatings maintain their flexibility after cure. Other crosslinking agents, such as melamine-formaldehyde crosslinking agents, can be used but may require higher cure temperatures to obtain the same flex stability after cure, and sometimes lose some of this flexibility while aging under cool and/or dry conditions. To maintain stability of the laminate material, the cure temperature should be as low as possible above 100° C., since flexible circuits undergo more distortion at higher cure temperatures.

Fillers

The aqueous processable, photoimageable coating compositions of this invention may optionally contain a pre-formed macromolecular elastomeric component as an organic filler. This elastomeric component typically is present as a separate micro-phase in the aqueous processable coating composition, and as such is believed to be functioning as an elastomeric filler for the composition. Typically, such organic components contain substantially no acidic groups and consequently are insoluble in aqueous, alkaline developer solutions. However, dispersibility in the permanent coating composition and aqueous, alkaline developer solutions may be improved by incorporating sufficient carboxylic acid groups into the organic filler component if improvement in such development is required.

Although many elastomers may be used in the photoimageable composition, poly(methyl methacrylate-co-butadiene-co-styrene) is preferred. Other organic fillers which may be used include synthetic flexible polymers and rubbers, e.g., butadiene-co-acrylonitrile, acrylonitrile-co-butadiene-co-styrene, methacrylate-co- acrylonitrile-co-butadiene-co-styrene copolymers, and styrene-co-butadiene-co-styrene, styrene-co-isoprene-co-styrene block copolymers; saturated polyurethanes; poly(methylmethacrylate-co-butylacrylate); and the like. Further examples of organic filler components include conventional elastomers as defined on page 232 of "Hackhis Chemical Dictionary" Fourth Edition, Edited by J. Grant, McGraw-Hill Book Company, 1972.

The photoimageable compositions may also contain other organic fillers or inorganic particulates to modify the mechanical or chemical properties required during processing or end use. Suitable fillers include organic or inorganic reinforcing agents which are essentially transparent as disclosed in U.S. Pat. No. 2,760,863, e.g., organophilic silica bentonite, silica, and powdered glass having a particle size less than 0.4 micrometer; inorganic thixotropic materials as disclosed in U.S. Pat. No. 3,525,615 such as boehmite alumina, clay mixtures of highly thixotropic silicate oxide such as bentonite and finely divided thixotropic gel containing 99.5% silica with 0.5% mixed metallic oxide; microcrystalline thickeners as disclosed in U.S. Pat. No. 3,754,920 such as microcrystalline cellulose and microcrystalline silicas, clays, alumina, bentonite, kalonites, attapultites, and montmorillonites; finely divided powders having a particle size of 0.5 to 10 micrometers as disclosed in U.S. Pat. No. 3,891,441 such as silicon oxide, zinc oxide, and other commercially available pigments; and the binder-associated, transparent, inorganic particles as disclosed in European Patent Application 87113013.4 such as magnesium silicate (talc), aluminum silicate (clay), calcium carbonate and alumina. Typically, the filler is transparent to actinic radiation to preclude adverse effects during imaging exposure. Depending on its function in the photoimageable composition, the filler may be colloidal or have an average particle size of 0.5 micrometers or more in diameter.

Adhesion Promotor

The photoimageable composition may also contain a heterocyclic or mercaptan compound to improve adhesion of the coating to the metal circuit pattern during processing or in the end-use product. Suitable adhesion promoters include heterocyclics such as those disclosed in Hurley et al, U.S. Pat. No. 3,622,334, Jones, U.S. Pat. No. 3,645,772, and Weed, U.S. Pat. No. 4,710,262. Preferred adhesion promoters include benzotriazole, 5-chloro-benzotriazole, 1-chloro-benzotriazole, 1-carboxy-benzotriazole, 1-hydroxy-benzotriazole, 2-mercapto benzoxazole, 1 H-1,2,4-triazole-3-thiol, 5-amino-1,3,4-thiadiazole-2-thiol, and mercapto-benzimidazole.

Other Components

Other compounds conventionally added to photopolymer compositions may also be present in the photoimageable composition to modify the physical properties of the film. Such components include: thermal stabilizers, colorants such as dyes and pigments, coating aids, wetting agents, release agents, and the lee like.

Thermal polymerization inhibitors that can be used in the permanent coating compositions are: Irganox® 1010, p-methoxyphenol, hydroquinone, and alkyl and aryl-substituted hydroquinones and quinones, tert-butyl catechol, pyrogallol, copper resinate, naphthylamines, beta-naphthol, cuprous chloride, 2,6-di-tert-butyl-p-cresol, phenothiazine, p-toluquinone and chloranil. Also useful as thermal polymerization inhibitors are the nitroso compounds disclosed in U.S. Pat. No. 4,168,982.

Various dyes and pigments may be added to increase the visibility of the resist image. Any colorant used, however, should preferably be transparent to the actinic radiation used.

The photopolymerazable compositions of this invention can also contain non-brominated flame retardants or synergists such as diethyl-N,N-bis(2-hydroxyethyl) aminomethyl phosphonate, gamma-ipropanolisobutylphosphine oxide, resorcinol bis(diphenylphosphate), poly (aryloxyphosphazenes) and tri(isopropylphenyl) phosphate.

In order to achieve adequate flame retardancy, an amount of antimony oxide can be added which is known to be a synergistic flame retardant when added to brominated compounds. Any of the antimony oxides can be used, preferably as a colloidal dispersion.

Photopolymerizable compositions of this invention can also contain a non-brominated, nongaseous ethylenically unsaturated compound having a boiling point above 100° C. at normal atmospheric pressure and being capable of forming a high polymer by photoinitiated addition polymerization, such as mono or polyfunctional acrylates or methacrylates. Suitable monomers which can be used to optimize desired properties include the following: t-butyl acrylate, 1,5-pentanediol diacrylate, N,N-diethylarninoethyl acrylate, ethylene glycol diacrylate, 1,4-butanediol diacrylate, diethylene glycol diacrylate, hexamethylene glycol diacrylate, 1,3-propanediol diacrylate, decamethylene glycol diacrylate, decamethylene glycol diinethacrylate, 1,4-cyclohexanediol diacrylate, 2,2-dimethylolpropane diacrylate, glycerol diacrylate, tripropylene glycol diacrylate, glycerol triacrylate, trinethylolpropane triacrylate, pentaerytritol triacrylate, polyoxyethylated trimethylolpropane triacrylate and trimethacrylate and similar compounds as disclosed in U.S. Pat. No. 3,380,831, 2,2-di (p-hydroxyphenyl)-propane diacrylate, pentaerythritol tetraacrylate, 2,2-di-(p-hydroxyphenyl)-propane dimethacrylate, triethylene glycol diacrylate, polyoxyethyl-2,2-d-(phydroxyphenyl)-propane dimethacrylate, bis(3-methacryl-oxy-2-hydroxypropyl)ether of bisphenol-A, bis (2-methacryloxyethylether of bisphenol-A, bis(3-acryloxy-2-hydroxypropyl)ether of bisphenol-A, bis(2-acryloxyethyl)ether of bisphenol-A, bis(3-methacryloxy-2-hydroxypropyl)ether of 1,4-butanediol, bis(3-methacryloxy-2-hydroxypropyl)ether of diphenolic acid, triethylene glycol dimethacrylate, polyoxypropylene trimethylol propane triacrylate (462), ethylene glycol dimethacrylate, butylene glycol dimethacrylate, 1,3-propanediol dimethacrylate, 1,2, 4butanetriol trimethacrylate, 2,2,4trimethyl-1,3-pentanediol dimethacrylate, pentaerytitol trimethacrylate, 1-phenyl ethylene-1,2-dimethacrylate, pentaerytiritol tetrrmethacrylate, trimethylol propane trimethacrylate, 1,5-pentanediol dimethacrylate, diallyl fumarate, styrene, 1,4-benzenediol dimethacrylate, 1,4-diisopropenyl benzene, and 1,3,5-triiso-propenyl benzene. A class of monomers are an alkylene or a polyalkylene glycol diacrylate prepared from an alkylene glycol of 2 to 15 carbons or a polyalkylene ether glycol of 1 to 10 ether linkages, and those disclosed in U.S. Pat. No. 2,927,022, e.g., those having a plurality of addition polymerizable ethylenic linkages particularly when present as terminal linkages. Preferred are those wherein at least one and preferably most of such linkages are conjugated with a double bonded carbon, including carbon double bonded to carbon and to such heteroatoms as nitrogen, oxygen and sulfur. Also preferred are such materials wherein the ethylenically unsaturated groups, especially the vinylidene groups, are conjugated with ester or amide structures.

Based on essential components (a) to (g) described hereinabove, a preferred flame-retardant, photoimnageable resin composition comprises (a) from 25 to 45% by weight of a copolymer of 25 weight % of dibromostyrene, 59 weight % of ethyl acrylate and 16 weight % of acrylic acid having a weight average molecular weight ($M_w$) of 40,000 to 500,000 and containing from 5 to 30% bromine by weight; (b) from 3 to 10% by weight of a copolymer of itaconic anhydride, itaconic acid, butyl acrylate, butyl methacrylate and styrene reacted with n-butylamine having a $M_w$ of 4,000; (c) from 8 to 20% by weight of a urethane diacrylate derived from the reaction of 2,6-toluene diisocyanate and a polyol, end-capped with hydroxyethyl acrylate; (d) from 10 to 30% by weight of a brominated epoxy diacrylate derived from the reaction of tetra-bromobisphenol-A diglycidyl ether with acrylic acid and containing from 10 to 80% bromine by weight; (e) from 2 to 20% by weight of a reactive mixed diester of 3,4,5,6-tetrabromo-1,2-benzene dicarboxylic acid with diethylene glycol and propylene glycol containing from 10 to 85% bromine by weight; (f) from 0.01 to 5% by weight of a photo-initiator system; and (g) from 5 to 15% by weight of a methyl ethyl ketoxime blocked 1,6-diisocyanatohexane trimer thermal cross4inking agent, wherein the total amount of bromine in the composition ranges from 5 to 50% by weight.

A further aspect of the present invention relates to a flame-retardant, aqueous processable, photo-imageable, multilayer, permanent coating element that has sufficiently low tack to avoid premature adhesion when placed in contact with a printed circuit substrate, but yet develops good adhesion to the substrate upon application of heat and pressure during lamination. The coating element effectively encapsulates raised relief structures without air entrapment and can be rapidly developed in aqueous 1% sodium or potassium carbonate in less than 5 minutes at 40° C. The coating element also has acceptable end-use properties such as resistance to multiple 260° C. solder exposures for 2 to 6 seconds, resistance to gold plating baths and other permanent coating properties as described in the Institute for Printed Circuits (IPC) Solder Mask 840B Specification.

The photoimageable coating element provides an overall balance of desirable properties including excellent flame-retardancy by using at least two different layers of photo-imageable permanent coatings. The layer of photoimageable coating in direct contact with the printed circuit substrate, or first layer, contains at least 5% by weight of an amphoteric binder which provides a layer having sufficiently low tack to avoid premature adhesion to the printed circuit substrate but develops good adhesion to the circuit substrate upon application of heat and pressure during lamination. The photo-imageable composition of the second layer is previously described hereinabove and provides the solder resistance and the flame-retardant properties mentioned above.

The first layer of photoimageable permanent coating may be adjacent to a support film or a cover film. Preferably, the first layer is applied by conventional means to the temporary support film from a solution and then dried. The second *layer of photoimageable permanent coating may be applied as a solution or a preformed layer to the exposed surface of the first layer by conventional means to obtain high adhesion between these two layers. In an alternative embodiment, the second layer also may be applied as a solution to the temporary support film, and then the first layer may be applied as a solution or a preformed layer to the exposed surface of the second layer by conventional means to obtain high adhesion between the two layers. In these two embodiments, a temporary support film is preferably laminated to the exposed surface of the second layer, or a cover film is laminated to the exposed surface of the first layer, respectively, so that the first and second photoimageable permanent coating layers are sandwiched between and protected by the support film and the cover film. For the two cases, the first layer should release from its protective cover layer before the second layer releases from its protective support layer. Upon removal of the cover film, the first layer can be applied to the printed circuitry while the second layer still remains protected. The first layer which is in contact with the circuit substrate, usually copper and dielectric, has low adhesion to the circuit substrate under ambient conditions, but develops high adhesion upon application of heat and pressure such as during vacuum or roll lamination processing. The first layer has high adhesion to the second layer, so that after lamination under heat and pressure, the remaining protective support film can be removed from the second layer without delamination between the two layers or between the first layer and the circuit substrate.

The first and second layers are developable with about the same concentration of aqueous alkaline solution, such as 1% sodium or potassium carbonate in less than 5 minutes at 40° C., so that the entire thickness of the first and second layers can be washed away in a single development step to leave a resist image of both layers on the substrate surface.

The combined thickness of the photoimageable layers depends on the relief pattern on the surface of the circuit substrate. Generally, the total thickness will be no greater than 125 microns (5 mils). When the permanent coating composition is used in vacuum or roll lamination, the total thickness will generally be no greater than 76 microns (3 mils). Normally, the first layer will comprise from 0.01 to 30%, preferably from 0.05 to 10%, of the combined layer thickness.

Temporary Support Film

Any of the support films generally known for use in photoresist films can be used. The temporary support film, which preferably has a high degree of dimensional stability to temperature changes, may be selected from a wide variety of polyamides, polyolefins, polyesters, vinyl polymers and cellulose esters, and may have a thickness ranging from 6 to 200 microns. A particularly preferred support film is polyethylene terephthalate having a thickness of about 25 microns. The temporary support film can be surface treated to improve release properties with substances such as silicones. At least one surface of the support film may have a matte surface obtained by incorporation of filler particles in, or embossing the surface of, the temporary support film.

Cover Film

The photoimageable permanent coating layer may be protected by a removable cover film to prevent blocking when it is stored in roll form which is removed prior to lamination. The protective cover film may be selected from the same group of high polymer films described for the temporary support film, supra, and may have the same wide range of thicknesses. A cover film of 15–30 microns thick polyethylene or polypropylene, polyethylene terephthalate or silicone treated polyethylene terephthalate, are especially suitable. At least one surface of the cover film may have a matte surface obtained either by incorporation of filler particles in, or embossing the surface of, the cover film.

The first layer of the multilayer photoimageable permanent coating, preferably, contains (a') from 5 to 25% by weight of amphoteric binder, (b') from 30 to 80% by weight of carboxyl containing copolymer binder, (c') from 5 to 30% by weight of an ethylenically unsaturated monomer; and (d') from 0.5 to 10% by weight of a photoinitiator or photoinitiator system.

(a') Amphoteric Binder

The first photoimageable permanent coating layer contains, as an essential component (a'), from 5 to 25% by weight of the layer composition of an amphoteric polymer binder.

The amphoteric polymers which are necessary components of the first layer of the photoimageable composition are copolymers derived from the copolymerization of (1) at least one basic comonomer which is an acrylic or methacrylic acrylamide or methacrylamide, an aminoalkyl acrylate or methacrylate or mixture of any of these; (2) at least one acidic comonomer containing one or more carboxyl groups and (3) at least one further comonomer which is acrylic or methacrylic in character.

The applicable N-substituted acrylamides or methacrylamides are substituted with alkyl radicals containing from 1–12 carbon atoms. Among the applicable acrylamides and methacrylamides are included N-ethyl acrylamide, N-tertiary-butyl acrylamide, N-n-octyl acrylamide, N-tertiary-octyl acrylamide, N-decyl acrylamide, N-dodecyl acrylamide, as well as the corresponding methacrylamides. Suitable aminoalkyl compounds are the $(C_{1-4})$ alkyl $(C_{2-4})$ aminoalkyl acrylates and methacrylates.

Suitable acidic comonomers for the amphoteric polymers are those having at least one available carboxylic acid group. These include acrylic acid, methacrylic acid, crotonic acid, itaconic acid, maleic acid, fumaric acid and the $C_1$–$C_4$ alkyl half esters of maleic and fumaric acids, such as methyl hydrogen maleate and butyl hydrogen fumarate as well as any other acidic monomers which are capable of being copolymerized with the particular copolymer system.

In order to modify or enhance certain properties of the amphoteric polymer, such as adhesion, compatibility, water solubility, hardness, flexibility, antistatic properties and the like, any of the following acrylic and methacrylic comonomers can be used: acrylic and methacrylic acid esters of aliphatic alcohols having from 1 to 12 carbon atoms such as methyl, ethyl, propyl, butyl, octyl and lauryl alcohols; hydroxyalkyl esters of acrylic and methacrylic acids such as hydroxypropyl acrylate and methacrylate, hydroxybutyl acrylate and methacrylate, hydroxystearyl acrylate and methacrylate, and hydroxyethyl acrylate and methacrylate; alkyl ($C_1$–$C_4$) amino alkyl ($C_2$–$C_4$) esters of acrylic and methacrylic acids such as N,N'-diethylaminoethyl acrylate, N-tertiary-butylaminopropyl acrylate, N,N'-dimethylaminoethyl methacrylate, N-tertiary-butylaminoethyl methacrylate and the quaternization product of dimethylaminoethyl methacrylate and dimethyl sulfate, diethyl sulfate and the like; diacetone acrylamide; vinyl esters such as vinyl acetate and vinyl propionate; and styrene monomers such as styrene and alpha-methyl styrene.

Preferred amphoteric copolymers are those containing from about 30–60% by weight of the N-substituted acrylamide or methacrylamide, from 10–20% by weight of the acidic comonomer, and up to 55% by weight of at least one copolymerizable comonomer; these percentages being based on the total weight of the copolymer.

Particularly preferred because they combine the best physical properties are those copolymers containing from 35–45% by weight of N-tertiary-octyl acrylamide, from 12–18% by weight of acrylic or methacrylic acid, from 32–38% by weight of methyl methacrylate, from 2–10% by weight of hydroxypropyl acrylate, and from 2–10% by weight of an alkyl ($C_1$–$C_4$) amino alkyl ($C_2$–$C_4$) acrylate or methacrylate.

Preparation of the above-described acrylic copolymers is described in U.S. Pat. No. 3,927,199 to Micchelli et al.

(b') Carboxylic Copolymer Binder

The carboxyl containing copolymer binder (b') used in the first layer of photoimageable permanent coating contains the monomer unit of the formula

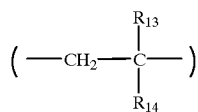

wherein $R_{13}$ is H or $C_{1-4}$ alkyl, $R_{14}$ is phenyl or —$CO_2R_{15}$; and $R_{15}$ is H or $C_{1-4}$ alkyl, which can be substituted with one or more hydroxy groups. Suitable comonomers which form the monomer unit of the copolymer include styrene and unsaturated carboxylic acids and their derivatives, such as (meth)acrylic acid and (meth)acrylates. Methyl methacrylate, methyl acrylate, ethyl acrylate, butyl acrylate, ethyl methacrylate, butyl methacrylate, 2-hydroxyethyl acrylate and 2-hydroxyethyl methacrylate are particularly preferred.

The carboxylic copolymer binder used in the first layer can be formed by direct copolymerization of one or more ethylenically unsaturated dicarboxylic acid anhydrides with one or more of the comonomers described above. Suitable ethylenically unsaturated dicarboxylic acid anhydrides are, for example, maleic anhydride, itaconic acid anhydride and citraconic acid anhydride. The copolymer binder containing acid anhydride functionality can be reacted with primary or secondary alcohols or amines.

When the permanent coating is photoprinted, development of the composition requires that the copolymer binder contains sufficient carboxylic acid groups to render the permanent coating processable in aqueous alkaline developer. The coating layer will be removed in portions which are not exposed to radiation but will be substantially unaffected in exposed portions during development by aqueous alkaline liquids, such as wholly aqueous solutions containing 1% sodium or potassium carbonate by weight for a time period of five minutes at a temperature of 40° C. The acid number of the copolymer binder used in the first photoimageable permanent coating layer should be 40 to 160, preferably 60 to 150, to also optimize adhesion to the printed circuit substrate.

In order to have sufficient conformability and resistance to drastic changes in environmental conditions, the permanent coating requires that the binder material have a glass transition temperature less than 100° C. The binder material for the first photoimageable permanent coating layer should have a glass transition temperature preferably from 30° C. to 100° C. If the $T_g$ of the binder material is less than 30° C., adherence to the support film can be too high for desired release.

The proper molecular weight range is required for manufacturing purposes, such as solution viscosity and process latitude, as well as for a proper balance of permanent coating properties, such as toughness and solder resistance. A copolymer binder molecular weight range of from about 25,000 to 500,000 is suitable. The preferred range is from about 40,000 to 250,000.

The quantity of total carboxylic copolymer binder present in the first photoimageable coating layer is generally 30 to 80% by weight relative to the total components of the permanent coating composition.

(c') Ethylenically Unsaturated Monomer

The monomer used as a component of the first layer of photoimageable coating provides the capability of the permanent coating composition to photopolymerize and contributes to overall properties. In order to effectively do so, the monomer should contain at least two ethylenically unsaturated groups capable of undergoing polymerization on exposure to actinic radiation when incorporated in the permanent coating element. Excessive amounts of trifunctional acrylate monomers can result in reduction of required flexibility. It is desirable to have a relatively lower level of monomer concentration in the first permanent coating layer in order to ensure that adhesion of the first layer to the support film is not excessive.

Suitable monomers (c') which can be used as the sole monomer or in combination with others include acrylate and methacrylate derivatives of alcohols, isocyanates, esters, epoxides and the like. Examples are diethylene glycol diacrylate, trimethylolpropane triacrylate, pentaerythritol triacrylate, poly-oxyethylated and polyoxypropylated trimethylolpropane triacrylate and trimethacrylate and similar compounds as disclosed in U.S. Pat. No. 3,380,831, di-(3-methacryloxy-2-hydroxypropyl) ether of tetrachloro-bisphenol-A, di-(2-methacryloxyethyl) ether of tetrachloro-bisphenol-A, di-(3-methaciyloxy-2-hydroxypropyl) ether of tetra-bromobisphenol-A, di-(2-methacryloxyethyl) ether of tetrabromo-bisphenol-A, triethylene glycol dimethacrylate, trimethylol propane triacrylate, polycaprolactone diacrylate, and aliphatic and aromatic urethane oligomeric di(meth) acrylates from Sartomer, West Chester, Pa. and Ebecryl® 6700 available from UCB Chemicals, Smyrna, Ga.

A particularly preferred class of comonomers is hexamnethylene glycol diacrylate, triethylene glycol diacrylate, tripropylene glycol diacrylate, trimethylolpropane triacrylate, polyoxyethylated trimethylolpropane triacrylate, poly-oxypropylated trinmethylolpropane triacrylate, pentaerythritol tri- and tetraacrylate, bisphenol-A diacrylate, di-(3-acryloxy-2-hydroxypropyl) ether of bisphenol-A, di-(3-acryloxy-2-hydroxypropyl) ether of tetrabromo-bisphenol-A, or methacrylate analogues thereof as well as aliphatic urethane diacrylates CN 961 and CN 964, and aromatic urethane diacrylates CN 971 and CN 972 available from Sartomer, West Chester, Pa.

The quantity of total ethylenically unsaturated monomer (c') is generally 5 to 30% by weight relative to the total components of the first photoimageable permanent coating layer.

(d') Photoinitiator System

From 0.01 to 10% by weight of a photoinitiator system as previously described hereinabove, is used in the first photoimageable coating layer. It is preferred to use a photoinitiator system in the first photoimageable coating layer that has an absorbence maximum at about the absorbence minimum for the second photoimageable layer. In this manner, sufficient incident exposure radiation will be able to pass through the second layer to expose the first layer in a similar time period as for the second layer.

A preferred photoimageable composition for use as the first coating layer comprises (a') from 5 to 25% by weight of an amphoteric copolymer binder of 40 weight % N-tertiary-ctylacrylamide, 35 weight % methylmeth-acrylate, 16 weight % acrylic acid, 5 weight % hydroxypropyl methacrylate and 4 weight % tertiarybutyl-aminoethyl methacrylate having a weight average molecular weight ($M_W$) of 50,000 and an acid number of 118; (b') from 30 to 80% by weight of a copolymer binder of 51 weight % methyl methacrylate, 29 weight % ethyl acrylate and 20 weight % methacrylic acid having a weight average molecular weight ($M_W$) of 40,000 and an acid number of 127; (c') from 5 to 30% by weight of trimethylolpropane triacrylate; and (d') from 0.01 to 10% by weight of a photoinitiator system.

Permanent Coating Process

Photoimageable permanent coatings can be used as a solder mask to protect printed circuits during subsequent processing, primarily solder operations, and/or from environmental effects during use. Permanent coatings also are used as intermediate insulative layers, with or without development, in the manufacture of multilayer printed circuits.

In practice, the photoimageable coating or multilayer coating element with the photoimageable layers typically between 10 and 125 micrometers (0.4 and 5 mils) thick, are applied to a printed circuit substrate which typically is a printed circuit relief pattern on a substrate that is semi-rigid.or. flexible. As discussed above, rigid substrates are generally made of glass-epoxy materials that are relatively thick and do not burn easily, thereby making it easier to form flame-retardant laminates. The thin film substrates, however, provide much lower resistance to burning and are difficult to flame retard. The photoimageable coating and multilayer coating element of the invention are particularly suitable for use with thin film substrates, i.e., those having a thickness less than 10 mils (0.25 mm), to form flame-retardant laminates. The applied photopolymerizable, permanent coatings are then imagewise exposed to actinic radiation to harden or insolubilize exposed areas. Any unexposed areas are then completely removed typically with an alkaline, aqueous sodium or potassium carbonate developer solution which selectively dissolves, strips or otherwise disperses the unexposed areas without adversely affecting the integrity or adhesion of the exposed areas. The developed permanent resist image is first treated to further cure or harden it by baking at elevated temperatures, such as one hour at 160° C., by additional uniform exposure to actinic radiation or a combination thereof to produce a circuit board having a cured permanent resist layer covering all areas except unexposed areas that have been removed by development. Electrical components are then inserted into the through-holes or positioned on surface mount areas and soldered in place to form the packaged electrical component.

The photoimageable permanent coating may be applied to a printed circuit substrate either as a liquid or as a pre-formed dry film.

Coating Liquids

The photoimageable, permanent coating may be coated as a liquid onto the printed circuit substrate using any conventional coating process. The liquid may be a solution or a dispersion of the permanent coating composition wherein the solvent is removed subsequent to coating to form a dry, solid, coverlay layer which, subsequent to coating, is directly imaged or exposed to actinic radiation to form a hardened coverlay layer. The liquids may be roller-coated, spin-coated, screen-coated or printed as disclosed in Coombs supra, in DeForest supra, in Lipson et al., U.S. Pat. No. 4,064,287, or in Oddi et al., U.S. Pat. No. 4,376,815. The liquid, typically as a solution, may also be curtain coated as disclosed in Losert et al., U.S. Pat. No. 4,230,793. In the instance where printed circuits are manufactured on a continuous web of film substrate, permanent coating liquid may be coated by any conventional web coating process.

Dry Film Lamination

A pre-formed, dry-film, photopolymerizable permanent coating layer is applied from a multi-ply, transfer, coverlay element using the lamination process as described in Celeste, U.S. Pat. No. 3,469,982. The multi-ply, permanent coating element comprises, in order, an actinic-radiation transparent, temporary support film, e.g., polyethylene terephthalate or silicon treated polyethylene terephthalate, a thin photo-polymerizable, permanent coating layer, and optionally a removable cover sheet, e.g., polyethylene or polypropylene, to protect the permanent coating element during storage. The photopolymerizable, permanent coating layer, is present in a range of thickness from 10 to 125 microns (0.4 to 5 mils) when used over printed circuit substrates. As described in Celeste supra, the cover sheet, if present, is first removed and the uncovered permanent coating surface is laminated to the pre-cleaned copper printed circuit surface of the substrate using heat and/or pressure, e.g., with a conventional hot-roll laminator. Although the laminate is typically imagewise exposed to actinic radiation through the temporary support film, in some instances, the temporary support may be removed before imaging to improve resolution and other such properties. Typically, when a dry film is laminated to a printed circuit substrate having a low circuit relief, measures must be taken to eliminate entrapped air, e.g., from around circuit lines. Entrapped air is eliminated by the vacuum lamination process of Friel U.S. Pat. No. 4,127,436, or by the grooved roll lamination process of Collier et al., U.S. Pat. No. 4,071,367.

Permanent Coating Evaluation

Printed circuits must withstand a variety of tests that are dependent on the application of the circuits, which in turn governs the type of material used as the circuit substrate. A stringent application is for flexible printed circuits which require a fold or bend for a particular space requirement, such as a camera or video cassette recorder (VCR), and may require the capability of surviving multiple bends, such as in a computer disc drive. In some applications a flexible circuit is combined with a rigid circuit to form a flex-rigid multi-layer printed circuit. The end use tests for flexible circuits focus on adhesion and the capability to withstand single or multiple bends. In addition, accelerated aging is a useful test to simulate the practical concern of film aging on standing at ambient conditions for an extended period of time. The accelerated aging by exposure of the film to heat and humidity is effective for identifying film components that may oxidize or otherwise degrade more quickly than others. The tests that are used to support the Examples in this application are described hereinbelow.

Time To Clear

This test evaluates the retention time for adequately developing coverlay. Coverlay is laminated onto a rigid substrate, then timed when placed through a 1% sodium carbonate or potassium carbonate developer solution (which should be at the same temperature as that used in actual processing, typically 40° C.). The total "time to clear" is reported in seconds, beginning from the time the sample enters the developer and ending at the time at which the unexposed coverlay is washed off of the substrate.

Photo Speed

This test evaluates the processability of coverlay. Green coverlay is laminated onto a substrate, then is exposed to 250 to 700 mj/cm$^2$ UV through a 21-step Stouffer sensitivity photopattern. After the sample is developed, the resulting step-wedge pattern is analyzed. Values are reported in a X-Y range, in which the X value is the last step in which no developer attack is noted and Y is the last step containing coverlay. The optimum exposure level is obtained at a y value of 10 to 12. High x values indicate low attack of the photopolymer by the developer.

Encapsulation

This test evaluates the capability of coverlay to adequately protect the substrate. The substrate and coverlay chosen for this test should represent those in end-use applications. The substrate is typically a circuit pattern and is processed with the coverlay exactly as is done in actual manufacturing. After processing, the sample is evaluated using 10X magnification for any haloing, air entrapment, and/or delaminations, which constitute a failure. In addition, the sample also may be cross-sectioned along the edge of a circuit line and evaluated using magnification to ensure that coverlay adequately covers the area with no "soda-strawing" defects. Before samples are processed further they should pass this encapsulation test Most of the examples passed the encapsulation test.

Cross-Hatch Adhesion

This test is performed according to ASTM D-3359-79, Method B. Test substrates are selected to duplicate the material typically used for end-use, and are processed to mirror actual processing.

Test substrates are either chemically cleaned substrates or substrates used without any pre-cleaning or etching of the copper surface. The samples that are chemically cleaned are cleaned in a series of steps with immersion first in Versa Clean® 415 for 2 minutes at 45° to 50° C. followed by immersion for 30 seconds in a deionized water bath. The samples are then immersed in Sure Etch® 550 micro etching solution for one minute at 35° C., followed by a deionized water rinse for 30 seconds. The samples are finally immersed in 10% sulfuric acid solution at room temperature for 30 seconds and given a final deionized water rinse. Samples are dried and placed immediately in a nitrogen atmosphere until used.

The test areas are a blank copper area and a blank adhesive area. Specimens are tested "after cure" as well as "after solder" exposure, which simulates solder exposure during PCB fabrication. Typical "after solder" specimens are floated in 288° C. 60/40 tin/lead solder for 30 seconds. Residual solder is then removed before evaluation. All specimens are scored with a 10 blade Gardco blade, then the sample is rotated 90° and rescored so that a cross-hatch pattern comprised of 100 squares is cut into the coverlay surface. Adhesive tape is applied and rubbed to ensure good contact, then pulled away at a 90° angle in a smooth fluid motion. The sample is examined using 10 X magnification for defects, typically delamination or microcracks. Pick off from the cutting blade of 1–2% is not considered a failure but >2% pickoff is a failed sample.

Bend & Crease

The substrate to be used for this test is typically a MIT flexural endurance pattern. The MIT pattern is a meander pattern that has alternating one mm lines and spaces in the region of the testing. The sample is creased perpendicular to the direction of the lines and spaces. The substrate is typically the same type as that used in the actual product application. The thickness and type of substrate (copper, adhesive) and the processing steps (pre-clean, lamination, cure, solder exposure) are duplicated so that the evaluation reflects a true simulation. Typically a Pyralux® LF9110 substrate is used with copper etched off of one side. Samples are bent and creased by hand 90° perpendicular to the lines and spaces in 10 different areas of each sample, then examined using 10X magnification for defects such as cracks or delaminations. Any reported defects constitute a failure. Samples are evaluated "after cure" and "after solder", in which case samples are floated, coverlay side up, in 288° C. 60/40 tin/lead solder for 30 seconds, then cooled to room temperature and evaluated as described above.

Chemical Resistance

This test is designed to analyze any degradation in film properties when exposed to chemicals in the photoimaging processing steps. Coverlay is processed on a circuit-patterned substrate (circuitry and substrate used should be of the same type as that found in actual use). Each sample is immersed for up to 15 minutes in a chemical typically used in processing. These chemicals include plating chemicals such as 10% NaOH, 10% HCl, 10% $H_2SO_4$ and cleaning solvents such as methyl ethyl ketone (MEK), trichloroethylene (TCE) and isopropanol (IPA). After immersion, each sample is examined using 10X magnification for defects such as delamination, wicking, embrittlement or solvent attack. Any defects found are reported.

Pencil Hardness

This test is designed to analyze changes in the hardness of the coverlay after exposure to isopropyl alcohol. Coverlay is processed onto a blank substrate. After curing, the substrate is evaluated for pencil hardness according to ASTM D-3363. The reported value is then compared with a substrate that was immersed in isopropanol for 10 minutes, blotted dry and evaluated using the same method. A rating of at least 4B is generally required for the film to be acceptable.

Flammability (UL94 Test)

Specimens were tested in accordance with the UL94 Thin Material Vertical Burning Test for classifying resist coating materials as 94VTM-0, 94VTM-1 or 94VTM-2. The 94VTM-0 classification is the best rating, indicating significantly reduced flammability.

Elongation to Break

The coating is laminated on Teflon® sheet, exposed at 250–700 mj/sq cm imagewise to generate one-half inch wide strips, developed at 40° C. for two times the time to clear, air dried and cured for one hour at 160° C. Samples tested as unconditioned material are placed into a zip-lock bag until testing. Samples that are conditioned are placed in a nitrogen-purged 100° C. oven, the temperature is held for 30 to 60 minutes, and then the samples are allowed to slowly cool to room temperature over a three hour period. The samples are placed in a desiccator with a purge of dry nitrogen, and held in this dry condition until tested on an Instron tester according to ASTM D-882-83 (Method A). The percent elongation is computed from the stress-strain data using Instron software Series IX Automated Materials Testing System 1.02C.

EXAMPLES

To further illustrate the invention, the following examples below are provided. All parts and percentages are by weight unless otherwise indicated. The compositions are given with solvent(s) as coating solutions and the percentages are the percentage of coating solution including solvent. Materials used for the examples are:

| | |
|---|---|
| Binders | |
| Brominated copolymer binder #1 | Copolymer of 59% ethyl acrylate, 25% dibromostyrene (DBS from Great Lakes Chemical) and 16% acrylic acid with a Tg ranging from 36° to 43° C., the weight average molecular weight ($M_w$) ranging from 95,000 to 160,000 and acid number of from 122 to 160, solution in 80/20 ethyl acetate/acetone. |
| Amic acid copolymer binder #1 | Copolymer of itaconic anhydride, itaconic acid, butyl acrylate, butyl methacrylate and styrene (23/4/38/20/15) reacted with n-butylamine having a weight average molecular weight ($M_w$) of 4,000; solution in 80/20 ethyl acetate/acetone. |
| Elvacite ® 2627 | Copolymer of methyl methacrylate, ethyl acrylate and methacrylic acid (51/29/20) having a $T_g$ of 87° C., weight average molecular weight ($M_w$) of 40,000 and acid number of 127. |
| Acrylic Polymer #1 | Pentapolymer of N-tertiary-octyl acrylamide, methyl methacrylate, acrylic acid, hydroxypropyl methacrylate, and tertiary-butylaminoethyl methacrylate (40/35/16/5/4) having a $T_g$ of 120° C., a weight average molecular weight ($M_w$) of 50,000 and an acid number of 118. |
| Carboset ® 515 | Acrylic acid containing copolymer having a $T_g$ of −14° C., a molecular weight of 7000, and an acid number of 63, from B. F. Goodrich, Cleveland, OH |
| Carboset ® 525 | Acrylic acid containing copolymer having a $T_g$ of 37° C., a molecular weight of 200,000, and an acid number of 80, from B. F. Goodrich, Cleveland, OH |
| Urethane Acrylates | |
| Ebecryl ® 6700 | Urethane diacrylate from UCB Chemicals, Smyrna, GA |
| Thermal Crosslinking Agents | |
| Blocked isocyanate #1 | Hexamethylene diisocyanate based polyisocyanate blocked with methyl ethyl ketoxime and dissolved at 75% solids in ethyl acetate or propylene glycol methyl ether acetate. |
| Blocked isocyanate #2 | Hexamethylene diisocyanate based polyisocyanate reacted with bis(2-hydroxyethyl ether) of tetrabromobisphenol A and blocked with methyl ethyl ketoxime and dissolved at 59.9% solids in ethyl acetate with the dry resin containing 15.8 weight % bromine. |
| Initiators | |
| o-Cl HABI | Hexaarylbiimidazole |
| EMK | Ethyl Michler's Ketone |
| Ebecryl ® P-36 | Benzophenone derivative acrylate from UCB Chemicals, Smyrna, GA |
| Irgacure ® 369 | 2-Benzyl-2-(dimethylamino)-1-[4-(4-morpholinyl)phenyl]-1-butanone from Ciba-Geigy Corporation, Hawthorne, NY |
| Detackifiers | Polyvinylpyrrolidone from GAF Chemicals |
| PVP K-120 | Corp., Texas City, TX. |
| PVP-K-90 | Polyvinylpyrrolidone from GAF Chemicals Corp., Texas City, TX. |
| Other Ingredients | |
| TMPTA | Trimethylolpropane triacrylate from UCB Chemicals Corp., Smyrna, GA. |
| DayGlo ® HM022A19 | Blue dye from Dayglo Corp., Cleveland, OH. |
| DayGlo ® 122-10321 | Blue dye from Dayglo Corp., Cleveland, OH. |
| Sevron ® Blue GMF | Green dye from Crompton & Knowles Corp., Reading, PA. |
| 3-MT | 3-mercapto-1H,2,4-triazole from Esprit Chemical Co., Rockland, MA. |
| 5-ATT | 5-amino-1,3,4-thiadiazole-2-thiol |
| Irganox ° 1010 | Antioxidant from Ciba Geigy Corp. Ardsley, NY |

-continued

| | |
|---|---|
| RCP-18584 | Flexibilizing agent which is the reaction product of ∈-caprolactone with 1,4-cyclohexanedimethanol (3:1) |
| Brominated Acrylated Monomer | |
| Brominated diacrylate monomer #1 | Bis-(3-acryloyloxy-2-hydroxypropyl)ether of tetrabromobisphenol-A. |
| Brominated Reactive Additive | |
| Saytex ® RB-79 | Diester/ether diol of tetrabromophthalic anhydride from Albemarie Corp., Baton Rouge, LA. |
| PHT-4 Diol | 3,4,5,6-Tetrabromo-1,2-benzene dicarboxylic acid mixed esters with diethylene glycol and propylene glycol from Great Lakes Chemical Corp., West Lafayette, IN |
| BA-50P | Bis(2-hydroxyethyl ether) of tetrabromo-bisphenol A from Great Lakes Chemical Corp., West Lafayette, IN |
| FR-522 | 2,2-Bis(bromomethyl)-1,3-Propanediol from Ameribrom, Inc., New York, NY |
| Carboxylated RB-79 | Reaction product of Saytex ® RB-79 from Albemarie Corp. with succinic anhydride. |
| Brominated Non-Reactive Additive | |
| Pyronil ® 45 | Di-2-ethylhexyl tetrabromophthalate from Elf Atochem North America, Philadelphia, PA. |

Carboxylated RB79 used in Example 2 was prepared by heating a solution of 529 g of Saytex® RB79, 84.3 g of succinic anhydride and 528 g of toluene at 115° C. for 4 hours. The reaction mixture was cooled, filtered to remove a small amount of solid impurity and concentrated to a viscous oil. The oil was dissolved in ethyl acetate with heating to reflux to give a solution of 71.4% solids.

Permanent Coating Formation

The coating solutions were converted to dry film product using a machine coater. The liquid compositions were coated on a 1 mil Mylar® polyethylene terephthalate support using a doctor knife to give approximately a 2 mil thick dried film composition. A three-zone dryer with each zone 15 feet long and with dryer temperatures of 50° C., 98° C. and 115° C. and a line speed of 20 feet per minute was used. Coating solution viscosities were measured using a Brookfield Viscometer with specific conditions given in the Examples (Model, Spindle, Speed in rpm).

Example 1

Example 1 illustrates a flame-retardant composition containing a brominated blocked polyisocyanate to improve flame retardency.

| Component | Example 1 (% by weight) |
|---|---|
| Methanol | 15.72 |
| Ethyl acetate | 10.86 |
| Brominated diacrylate monomer #1 | 11.47 |
| Ebecryl ® 6700 75% in ethyl acetate | 9.68 |
| 3-MT | 0.10 |
| o-Cl HABI | 0.50 |
| Benzophenone | 1.53 |
| EMK | 0.06 |
| PVP K-120 | 1.53 |
| Blocked isocyanate #2 | 15.18 |

-continued

| Component | Example 1 (% by weight) |
|---|---|
| Brominated copolymer binder #1 (57.8% solids, $M_w$ 114,000, $T_g$ 39° C. and Acid No. 136) | 24.44 |
| DayGlo ® HM022A19 | 1.63 |
| Amic acid copolymer binder #1 (47.7% solids, $M_w$ 4000) | 4.84 |
| Saytex ® RB79 | 2.48 |
| Wt. % Br in Film | 18.1 |
| Property | |
| Time-to-clear (sec) | 28 |
| Stepwedge response | 1–8 |
| Cure conditions | 160° C./1 hr |

Bend & Crease

Substrate: Pyralux ® LF9110[1] with copper etched off one side and a MIT pattern on the other side of the laminate

| After cure | Fail |
|---|---|
| After solder | 9/10 pass |

Cross-Hatch Adhesion

Substrate: Pyralux ® LF9110[1] that was chemically cleaned

| After cure | Pass |
|---|---|
| After solder | Pass |

Flammability (UL-94 VTM-0)

Substrate: double side etched Pyralux ® AP125EKJ[2]

| After cure | Pass VTM-0 |
|---|---|

% Elongation to Break

| Conditioned | 5 |
|---|---|

Pencil hardness before/after IPA Soak

| Before/after | HB/HB |
|---|---|

[1]Pyralux ® LF9110 is a laminate of 1 mil Kapton ® polyimide film, 1 mil acrylic adhesive and 1 oz/ft$^2$ copper foil, commercially available from E. I. du Pont de Nemours and Co.
[2]Pyralux ® AP125EKJ is an all-polyimide double side laminate of 1.25 mil polyimide film and 0.5 oz./ft.$^2$ of copper foil on both sides.

Example 2

Example 2 illustrates a flame-retardant composition containing a carboxylated, brominated plasticizer which reduces the amount of developer residue.

| Component | Example 2 (% by weight) |
|---|---|
| Methanol | 12.14 |
| Ethyl acetate | 16.02 |
| Brominated diacrylate monomer #1 | 10.13 |
| Ebecryl ® 6700 75% in ethyl acetate | 10.93 |
| 3-MT | 0.09 |
| o-Cl HABI | 0.24 |
| Ebecryl ® P-36 | 1.39 |
| EMK | 0.06 |
| PVP K-90 | 1.42 |
| Blocked isocyanate #1 | 6.08 |

-continued

| Component | Example 2 (% by weight) |
|---|---|
| Brominated copolymer binder #1 (54.2 solids, $M_w$ 104,000, Tg 43° C. and Acid No. 122) | 31.04 |
| Sevron ® Blue GMF | 0.02 |
| Amic acid copolymer binder #1 (47.7% solids, $M_w$ 4000) | 5.11 |
| TMPTA | 0.98 |
| Carboxylated RB79 | 4.35 |
| Wt. % Br in Film | 16.2 |
| Property | |
| Time-to-clear (sec) | 19 |
| Stepwedge response | 3–12 |
| Cure conditions | 160° C./1 hr |

Bend & Crease

Substrate: Pyralux ® LF9110[1] with copper etched off one side and a MIT pattern on the other side of the laminate

| After cure | Pass |
|---|---|
| After solder | Pass |

Cross Hatch Adhesion

Substrate: Pyralux ® LF9110[1] that was chemically cleaned

| After cure | Pass |
|---|---|
| After solder | Pass |

% Elongation to Break

| Conditioned | 23 |
|---|---|

Residue After Development

| Chemically cleaned | none |
|---|---|

[1]Pyralux ® LF9110 is a laminate of 1 mil Kapton ® polyimide film, 1 mil acrylic adhesive and 1 oz/ft$^2$ copper foil, commercially available from E. I. du Pont de Nemours and Co.

Examples 3 to 5

Examples 3 to 5 illustrate flame-retardant compositions containing brominated copolymer binder, brominated diacrylate monomer, and different brominated reactive additives.

| Component | Example 3 (% by weight) | Example 4 (% by weight) | Example 5 (% by weight) |
|---|---|---|---|
| Methanol | 11.50 | 11.52 | 11.56 |
| Acetone | 10.27 | 10.89 | 10.92 |
| Ebecryl ® 6700 75% in ethyl acetate | 10.83 | 10.85 | 10.88 |
| Brominated diacrylate monomer #1 75% in ethyl acetate | 13.91 | 13.94 | 13.98 |
| 3-MT | 0.10 | 0.10 | 0.10 |
| o-Cl HABI | 0.26 | 0.26 | 0.26 |
| Benzophenone | 1.52 | 1.53 | 1.53 |
| EMK | 0.06 | 0.06 | 0.06 |
| PVP K-90 | 1.52 | 1.53 | 1.53 |
| Brominated reactive additive PHT-4 Diol 75% in Acetone | 2.43 | — | — |
| Brominated reactive additive BA-50P ™ | — | 1.66 | — |
| Brominated reactive additive FR-522 | — | — | 1.38 |

-continued

| Component | Example 3 (% by weight) | Example 4 (% by weight) | Example 5 (% by weight) |
|---|---|---|---|
| Blocked isocyanate #1 75% in ethyl acetate | 6.48 | 6.49 | 6.50 |
| DayGlo ® HM022A19 | 1.63 | 1.63 | 1.63 |
| Amic acid copolymer binder #1 (47.7% Solids, $M_w$ 4000) | 4.79 | 4.80 | 4.81 |
| Brominated copolymer binder#1 (55.8% Solids, $M_w$ of 107,000, $T_g$ of 41° C., and Acid No. of 128) | 34.69 | 34.75 | 34.85 |
| Wt. % Br in Film | 15.2 | 15.2 | 15.2 |
| Adjusted to Coating viscosity (cps) (RVT, #3, 20) | 1250 | 1225 | 1300 |
| Property | | | |
| Time-to-clear (sec) | 17 | 18 | 16 |
| Stepwedge response | 5–9 | 3–8 | 2–9 |
| Cure conditions | 160° C./1 hr. | 160° C./1 hr. | 160° C./1 hr. |

Bend & Crease

Substrate: Pyralux ® LF9110[1] with copper etched off one side and a MIT pattern on the other side of the laminate

| | | | |
|---|---|---|---|
| After cure | Pass-9/10 | Pass | Pass |
| After solder | Pass | Pass | Pass |

Cross-Hatch Adhesion

Substrate: Pyralux ® LF9110[1] that was chemically cleaned

| | | | |
|---|---|---|---|
| After cure | Pass | Pass | Pass |
| After solder | Pass | Pass | Pass |

Flammability (UL-94 VTM-0)

Substrate: Teclam ® FNC111[2] with copper chemcially etched off both sides

| | | | |
|---|---|---|---|
| Result | VTM-0 | VTM-0 | VTM-0 |
| Total Burn Time (sec) | 8 | 9 | 16 |

Chemical Resistance

Substrate: Chemically cleaned Pyralux ® LF9110[1]

| | | | |
|---|---|---|---|
| 10% $H_2SO_4$ | Pass | Pass | Pass |
| Isopropyl Alcohol | Pass | Pass | Pass |
| Methyl Ethyl Ketone | Pass | Pass | Pass |
| 10% NaOH | Pass | Pass | Pass |

Pencil Hardness Before/After IPA Soak

| | | | |
|---|---|---|---|
| Before/After | HB/4B | HB/2B | HB/4B |

[1]Pyralux ® LF-9110 is a laminate of 1 mil Kapton ® polyimide film, 1 mil acrylic adhesive and 1 oz/ft² copper foil, commercially available from E. I. du Pont de Nemours and Company
[2]Teclam ® FNC111 is a laminate material of 1 mil Kapton ® polyimide film coated on two sides with 1 mil epoxy-based adhesive and cured with 1 oz/ft² copper foil laminated to the adhesive side, available from E. I. du Pont de Nemours and Company Example 6

Example 6 illustrates a flame-retardant composition containing brominated copolymer binder, brominated diacrylate monomer, and a brominated non-reactive additive.

| Component | Example 6 (% by weight) |
|---|---|
| Methanol | 11.50 |
| Acetone | 10.87 |
| Ebecryl ® 6700 75% in ethyl acetate | 10.83 |
| Brominated diacrylate monomer #1 75% in ethyl acetate | 13.91 |
| 3-MT | 0.10 |
| o-C1 HABI | 0.26 |
| Benzophenone | 1.52 |
| EMK | 0.06 |
| PVP K-90 | 1.52 |
| Brominated non-reactive additive Pyronil ® 45 | 1.87 |
| Blocked isocyanate #1 75% in ethyl acetate | 6.47 |
| DayGlo ® HM022A19 | 1.63 |
| Amic Acid copolymer binder #1 (47.7% Solids, $M_w$ 4000) | 4.79 |
| Brominated copolymer binder #1 (55.8% Solids, $M_w$ of 107,000 $T_g$ of 41° C., and Acid No. of 128) | 34.68 |
| Wt. % Br in Film | 15.2 |
| Adjusted to Coating Viscosity (cps) (RVT, #3, 20) | 1200 |
| Property | |
| Time-to-clear (sec) | 17 |
| Stepwedge response | 1–9 |
| Cure conditions | 160° C./1 hr. |

Bend & Crease

Substrate: Pyralux ® LF9110[1] with copper etched off one side and a MIT pattern on the other side of the laminate

| | |
|---|---|
| After cure | Pass |
| After cure | Pass |

Cross-Hatch Adhesion

Substrate: Pyralux ® LF9110[1] that was chemically cleaned

| | |
|---|---|
| After cure | Pass |
| After solder | Pass |

Flammability (UL-94 VTM-0)

Substrate: Teclam ® FNC111[2] with copper chemically etched off both sides

| | |
|---|---|
| Result | VTM-0 |
| Total Burn Time (sec) | 8 |

Chemical Resistance

Substrate: Chemically cleaned Pyralux ® LF9110[1]

| | |
|---|---|
| 10% $H_2SO_4$ | Pass |
| Isopropyl Alcohol | Pass |
| Methyl Ethyl Ketone | Pass |
| 10% NaOH | Pass |

Pencil Hardness Before/After IPA Soak

| | |
|---|---|
| Before/After | HB/4B |

[1]Pyralux ® LF-9110 is a laminate of 1 mil Kapton ® polyimide film, 1 mil acrylic adhesive and 1 oz/ft² copper foil, commercially available from E. I. du Pont de Nemours and Company
[2]Teclam ® FNC111 is a laminate material of 1 mil Kapton ® polyimide film coated on two sides with 1 mil epoxy-based adhesive and cured with 1 oz/ft² copper foil laminated to the adhesive side, available from E. I. du Pont de Nemours and Company Examples 7 to 9

Examples 7 to 9 illustrate flame-retardant compositions, containing brominated copolymer binder, brominated diacrylate monomer, and different brominated reactive additives, that were coated on 1 mil Mylar® polyethylene terephthalate film which had previously been coated with a 1.4μ low tack sublayer containing the following ingredients:

| | % by weight |
|---|---|
| Methanol | 75.20 |
| Water | 9.40 |
| Propylene Glycol Methyl Ether (Dowanol ® PM) | 9.40 |
| Acrylic Polymer #1 | 1.02 |
| Elvacite ® 2627 | 3.85 |
| 5-ATT | 0.01 |
| PVP K-90 | 0.48 |
| TMPTA | 0.48 |
| Irgacure ® 369 | 0.16 |

| Component | Example 7 | Example 8 | Example 9 |
|---|---|---|---|
| Flame retardant compositions coated on low tack sublayer | Example 3 | Example 4 | Example 5 (1.3 mil instead of 2.0 mil coating) |
| Property | | | |
| Time-to-clear (sec) | 16 | 17 | 10 |
| Stepwedge response | 1–9 | 1–9 | 6–10 |
| Cure conditions | 160° C./1 hr. | 160° C./1 hr. | 160° C./1 hr. |
| Bend & Crease | | | |
| Substrate: Pyralux ® LF91110[1] with copper etched off one side and MIT pattern on the other side of the laminate | | | |
| After cure | Pass | Pass-6/10 | Pass-9/10 |
| After solder | Pass | Pass | Pass |
| Cross-Hatch Adhesion | | | |
| Substrate: Pyralux ® LF9110[1] that was chemically cleaned | | | |
| After cure | Pass | Pass | Pass |
| After solder | Pass | Pass | Pass |
| Flammability (UL-94 VTM-0) | | | |
| Substrate: Teclam ® FNC111[2] with copper chemically etched off both sides | | | |
| Result | VTM-0 | VTM-0 | VTM-0 |
| Total Burn Time (sec) | 18 | 13 | 18 |
| Chemical Resistance | | | |
| Substrate: Chemically cleaned Pyralux ® LF9110[1] | | | |
| 10% $H_2SO_4$ | Pass | Pass | Pass |
| Isopropyl Alcohol | Pass | Pass | Pass |
| Methyl Ethyl Ketone | Pass | Pass | Pass |
| 10% NaOH | Pass | Pass | Pass |
| Pencil Hardness Before/After IPA Soak | | | |
| Before/After | HB/2B | HB/2B | HB/2B |

[1]Pyralux ® LF-9100 is a laminate of 1 mil Kapton ® polyimide film, 1 mil acrylic adhesive and 1 oz/ft² copper foil, commercially available from E. I. du Pont de Nemours and Company
[2]Teclam ® FNC111 is a laminate material of 1 mil Kapton ® polyimide film coated 5 on two sides with 1 mil epoxy-based adhesive and cured with 1 oz/ft² copper foil laminated to the adhesive side, available from E. I. du Pont de Nemours and Company Example 10

Example 10 illustrates a flame-retardant composition containing brominated copolymer binder, brominated diacrylate monomer, and a brominated non-reactive additive, that was coated on 1 mil Mylar® polyethylene terephthalate film which had previously been coated with a 1.4μ low tack sublayer as described for Examples 7 to 9.

| Component | Example 10 |
|---|---|
| Flame retardant composition coated on low tack sublayer | Example 6 |
| Property | |
| Time-to-clear (sec) | 18 |
| Stepwedge response | 1–9 |
| Cure conditions | 160° C./1 hr. |
| Bend & Crease | |
| Substrate: Pyralux ® LF9110[1] with copper etched off one side and a MIT pattern on the other side of the laminate | |
| After cure | Pass-9/10 |
| After solder | Pass |
| Cross-Hatch Adhesion | |
| Substrate: Pyralux ® LF9110[1] that was chemically cleaned | |
| After cure | Pass |
| After solder | Pass |
| Flammability (UL-94 VTM-0) | |
| Substrate: Teclam ® FNC111[2] with copper chemically etched off both side | |
| Result | VTM-0 |
| Total Burn Time (sec) | 13 |
| Chemical Resistance | |
| Substrate: Chemically cleaned Pyralux ® LF9110[1] | |
| 10% $H_2SO_4$ | Pass, slight halo |
| Isopropyl Alcohol | Pass |
| Methyl Ethyl Ketone | Pass |
| 10% NaOH | Pass |
| Pencil Hardness Before/After IPA Soak | |
| Before/After | HB/2B |

[1]Pyralux ® LF-9100 is a laminate of 1 mil Kapton ® polyimide film, 1 mil acrylic adhesive and 1 oz/ft² cooper foil, commercially available from E. I. du Pont de Nemours and Company
[2]Teclam ® FNC111 is a laminate material of 1 mil Kapton ® polyimide film coated on two sides with 1 mil epoxy-based adhesive and cured with 1 oz/ft² copper foil laminated to the adhesive side, available from E. I. du Pont de Nemours and Company Reference Examples 11–14

These examples illustrate the difficulty of obtaining flame-retardancy, flexibility, and aqueous-processability while maintaining other necessary properties without using all three types of brominated materials in the photoimageable resin composition. Reference Example 11 contains brominated acrylic monomer (component d) only without a brominated copolymer binder (component a) or brominated additive (component e). Reference Examples 12–14 contain combinations of brominated acrylic monomer and brominated additive, without the brominated copolymer binder. In the reference examples, an acrylic low molecular weight copolymer binder was used in place of the amic acid low molecular weight copolymer binder (component b) of the invention. While the amic acid polymer of this invention does have the advantage of being able to be converted by reactions within the polymer to less reactive and less moisture sensitive species on thermal curing, it does not materially affect the properties tested below.

| Component | Ref. Ex. 11 (% by weight) | Ref. Ex. 12 (% by weight) | Ref. Ex. 13 (% by weight) | Ref. Ex. 14 (% by weight) |
|---|---|---|---|---|
| Methanol | 20.00 | 18.90 | 17.11 | 16.92 |
| Ethyl Acetate | 32.68 | 28.75 | 29.62 | 29.30 |
| Ebecryl ® 6700 75% in ethyl acetate | 12.03 | 11.38 | 9.02 | 8.92 |
| Brominated diacrylate monomer #1 | 7.58 | 7.16 | 8.38 | 8.29 |
| 3-MT | — | — | 0.08 | 0.08 |
| 5-ATT | 0.09 | 0.08 | — | — |
| o-Cl HABI | 0.22 | 0.20 | 0.40 | 0.40 |
| Benzophenone | 1.20 | 1.13 | 1.25 | 1.24 |
| EMK | 0.04 | 0.04 | 0.05 | 0.05 |
| PVP K-120 | 1.29 | 1.23 | 1.22 | 1.20 |
| Brominated reactive additive PHT-4 Diol | — | — | 9.77 | — |
| Brominated reactive additive PHT-4 Diol 75% in Ethyl Acetate | — | 7.56 | — | — |
| Brominated reactive additive BA-50P ™ | — | — | — | 8.38 |
| Blocked isocyanate #1 75% in propylene glycol methyl ether acetate | 5.17 | — | — | — |
| Blocked isocyanate #1 75% in ethyl acetate | — | 4.90 | 5.29 | 5.23 |
| DayGlo ® 122-10321 | 1.29 | 1.23 | — | — |
| DayGlo ® HM022A19 | — | — | 1.33 | 1.32 |
| RCP-18584 | — | — | — | 2.39 |
| Irganox ® 1010 | 0.22 | 0.20 | — | — |
| Carboset ® 515 | 2.16 | 2.04 | — | — |
| Carboset ® 515 75% in ethyl acetate | — | — | 2.48 | 2.45 |
| Carboset ® 525 | 16.05 | 15.19 | 13.98 | 13.83 |
| Wt. % Br in Film | 7.0 | 11.8 | 16.0 | 15.3 |
| Adjusted to Coating viscosity (cps) (RVT, #3, 20) | 1300 | 1325 | 1325 | 1350 |
| Property | | | | |
| Time-to-clear (sec) | 53 | 36 | 18 | 27 |
| Stepwedge response | 10 | 0–7 | 5–11 | 6–12 |
| Cure conditions | 170° C./ 1 hr | 170° C./ 1 hr | 160° C./ 1 hr | 160° C./ 1 hr |

Bend & Crease

Substrate: Pyralux ® LF9110[1] with copper etched off one side and a MIT pattern on the other side of the laminate

| | | | | |
|---|---|---|---|---|
| After cure | — | Pass-0/10 | Pass-9/10 | Pass-5/10 |
| After solder | — | Pass | Pass | Pass |

Cross-Hatch Adhesion

Substrate: Pyralux ® LF9110[1] that was chemically cleaned

| | | | | |
|---|---|---|---|---|
| After cure | — | Pass | Pass | Pass |
| After solder | — | Pass | Pass | Pass |

Flammability (UL-94 VTM-0)

Substrate: Pyralux ® FR9111[3] (Ref. Ex. 11–12) or Teclam ® FNC111[2] (Ref. Ex. 13–14) with copper chemically etched off both sides

| | | | | |
|---|---|---|---|---|
| Result | VTM-1 | VTM-1 | VTM-0 | VTM-0 |
| Total Burn Time (sec) | 135 | 127 | 22 | 44 |

Chemical Resistance

Substrate: Chemically cleaned Pyralux ® LF9110[1]

| | | | | |
|---|---|---|---|---|
| 10% $H_2SO_4$ | — | Pass | Pass, Halo | Pass |
| Isopropyl Alcohol | — | Pass | Pass | Pass |
| Methyl Ethyl Ketone | — | Pass | Pass | Pass |
| 10% NaOH | — | Pass | Pass | Pass |

Pencil Hardness Before/After IPA Soak

| | | | | |
|---|---|---|---|---|
| Before/After | — | 2B/<6B | HB/<6B | HB/<6B |

[1]Pyralux ® LF-9110 is a laminate of 1 mil Kapton ® polyimide film, 1 mil acrylic adhesive and 1 oz/ft² copper foil, commercially available from E. I. du Pont de Nemours and Company
[2]Teclam ® FNC111 is a laminate material of 1 mil Kapton ® polyimide film coated on two sides with 1 mil epoxy-based adhesive and cured with 1 oz/ft² copper foil laminated to the adhesive side, available from E. I. du Pont de Nemours and Company
[3]Pyralux ® FR-9111 is a laminate material of 1 mil Kapton ® polyimide film coated on two sides with 1 mil acrylic adhesive and cured with 1 oz/ft² copper foil laminated to the adhesive side, available from E. I. du Pont de Nemours and Company As can be seen from the data above, Reference Examples 11 and 12 were not sufficiently flame retardant to achieve the necessary VTM-0 rating. Reference Examples 13 and 14 had unacceptably low pencil hardness ratings after a soak in isopropyl alcohol. It was also observed that Reference Examples 13 and 14: (1) were tacky making it difficult to position the film on a substrate; (2) exhibited lower than desired creep viscosity making film storage on a roll without deformation difficult; and (3) were incompletely removed by aqueous developer on chemically cleaned copper leaving an undesirable level of residue behind.

What is claimed is:

1. A flexible, flame-retardant, aqueous-processable photoimageable resin composition suitable for forming a flexible permanent, protective coating on a flexible printed circuit board comprising:

(a) a brominated carboxylic copolymer binder formed from (i) a ring-brominated aromatic monomer, (ii) at least one of an alkyl acrylate, alkyl methacrylate or a non-brominated aromatic monomer, wherein alkyl contains from 1 to 20 carbon atoms, and (iii) an ethylenically unsaturated carboxylic acid monomer, said binder having a weight average molecular weight ($M_W$) of from 40,000 to 500,000 and containing from 3 to 40% bromine by weight;

(b) a non-brominated low molecular weight copolymer binder having a weight average molecular weight ($M_W$) of from 2,000 to 10,000, which is the reaction product of a primary amine with a copolymer formed from at least one ethylenically unsaturated dicarboxylic acid anhydride and at least one ethylenically unsaturated comonomer and containing at least one structural unit A and at least one additional structural unit selected from $B_1$, $B_2$, and combinations thereof containing carboxyl groups, wherein:

(i) 5 to 50 percent by weight of said low molecular weight copolymer binder is formed from at least one structural unit $B_1$, $B_2$ or combination thereof containing carboxyl groups;

(ii) 50 to 95 percent by weight of said low molecular weight copolymer binder is formed from structural unit A, wherein A is different from structural units $B_1$ and $B_2$; and (iii) A, $B_1$ and $B_2$ have the structures:

A.
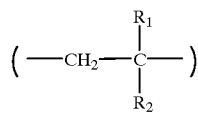

$B_1$.
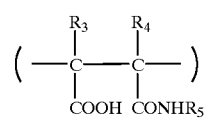

$B_2$.
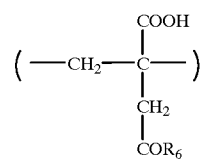

wherein $R_1$ is H, alkyl or aryl; $R_2$ is H, $CH_3$, aryl, $-COOR_7$, $-CONR_8R_9$ or $-CN$; $R_3$ and $R_4$ independently are H or al; $R_5$ is alkyl aryl or aryl which is substituted with primary amino, secondary amino, tertiary amino, hydroxy or ether groups or mixtures thereof; $R_6$ is $-OH$ or $NHR_5$; and $R_7$, $R_8$ and $R_9$ independently are H, alkyl, aryl or aryl substituted with one or more hydroxy, ester, keto, ether or thioether groups; wherein alkyl in any of the above R groups contains from 1 to 6 carbon atoms;

(c) an acrylated urethane monomeric component containing from 0 to 20% bromine by weight;

(d) a brominated acrylated monomer containing from 10 to 80% bromine by weight with the proviso that (d) is not a urethane monomeric component;

(e) a brominated additive containing from 10 to 85% bromine by weight with the proviso that (e) is not an acrylated monomeric component or a blocked polyisocyanate crosslinking agent;

(f) a photoinitiator or a photoinitiator system; and (g) a blocked polyisocyanate crosslinking agent containing from 0 to 30% bromine by weight, wherein the total content of bromine in the composition is in a range from 5 to 50% by weight, and further wherein when the composition is applied to a substrate with circuit lines, cured at a temperature greater than 100° C. for one hour, the cured composition is capable of being bent and creased at an angle 90° to the circuit lines without the formation of cracks or delaminations.

2. The photoimageable resin composition of claim 1 comprising, based on the total weight of the composition, from 10 to 60% by weight of the brominated carboxylic copolymer binder (a); from 2 to 15% by weight of the non-brominated copolymer binder (b); from 5 to 30% by weight of the acrylated urethane monomeric component (c); from 5 to 40% by weight of the brominated acrylated monomer (d); from 1 to 40% by weight of the brominated additive (e); from 0.01 to 10% by weight of the photoinitiator system (f); and from 2 to 20% by weight of the blocked polyisocyanate crosslinking agent (g).

3. The photoimageable resin composition of claim 2 comprising, based on the total weight of the composition, from 25 to 45% by weight of the brominated carboxylic copolymer binder (a); from 3 to 10% by weight of the non-brominated copolymer binder (b); from 8 to 20% by weight of the acrylated urethane monomeric component (c); from 10 to 30% by weight of the brominated acrylated monomer (d); from 2 to 20% by weight of the brominated additive (e); from 0.01 to 5% by weight of the photoinitiator system (f); and from 5 to 15% by weight of the blocked polyisocyanate crosslinking agent (g).

4. The photoimageable resin composition of claim 1 wherein the brominated carboxylic copolymer binder (a) comprises, the polymerized reaction ii product of (i) from 5 to 55% by weight of a ring-brominated aromatic monomer, (ii) from 20 to 92% by weight of at least one of an alkyl acrylate, alkyl methacrylate or a non-brominated aromatic monomer, and (iii) from 3 to 25% by weight of an ethylenically unsaturated carboxylic acid monomer based on the total weight of the copolymer.

5. The photoimageable resin composition of claim 4 wherein the ring-brominated aromatic monomer (i) is selected from styrene, methylstyrene, alpha-methylstyrene, alpha-methyl methylstyrene, ethylstyrene, alpha-methyl ethylstyrene, and combinations thereof, said monomers having mono, di, tri, or tetra bromine substitution in the phenyl nucleus.

6. The photoimageable resin composition of claim 5 wherein the ring-brominated aromatic monomer (i) is dibromostyrene.

7. The photoimageable resin composition of claim 4 wherein the alkyl acrylate or alkyl methacrylate monomer (ii) is selected from methyl (meth)acrylate, ethyl (meth)acrylate, n-propyl (meth)acrylate, isopropyl (meth)acrylate, n-butyl (meth)acrylate, isobutyl (meth)acrylate, n-amyl (meth)acrylate, n-hexyl (meth)acrylate, isohexyl (meth)acrylate, 2-ethylhexyl (meth)acrylate, n-heptyl (meth)acrylate, isoheptyl (meth)acrylate, n-methylheptyl (meth)acrylate, n-octyl (meth)acrylate, 6-methylheptyl (meth)acrylate, n-nonyl (meth)acrylate, 3,5,5-trimethyl (meth)acrylate, n-decyl (meth)acrylate and lauryl (meth)acrylate.

8. The photoimageable resin composition of claim 7 wherein the alkyl acrylate or alkyl methacrylate monomer (ii) is selected from ethyl acrylate, n-propyl acrylate, n-butyl acrylate and methyl methacrylate.

9. The photoimageable resin composition of claim 4 wherein the non-brominated aromatic monomer (ii) is selected from styrene, methyl styrene, alpha-methyl styrene, alpha-methyl methylstyrene, ethylstyrene, alpha-methyl ethylstyrene, benzylacrylate and benzyl methacrylate.

10. The photoimageable resin composition of claim 4 wherein the ethylenically unsaturated carboxylic acid monomer (iii) is selected from acrylic acid, methacrylic acid, itaconic acid, maleic acid and fumuaric acid.

11. The photoimageable resin composition of claim 10 wherein the ethylenically unsaturated carboxylic acid monomer is selected from methacrylic acid and acrylic acid.

12. The photoimageable resin composition of claim 1 wherein the non-brominated low molecular weight copolymer binder (b) comprises the reaction product of a primary amine with a copolymer formed by polymerization of an ethylenically unsaturated dicarboxylic acid anhydride and an ethylenically unsaturated comonomer.

13. The photoimageable resin composition of claim 12 wherein the ethylenically unsaturated dicarboxylic acid anhydride is selected from maleic acid anhydride, itaconic acid anhydride and citraconic acid anhydride.

14. The photoimageable resin composition of claim 12 wherein the primary amine is unsubstituted or substituted with a group selected from primary amino, secondary amino, tertiary amino, hydroxy, ester, keto, ether and thioether groups.

15. The photoimageable resin composition of claim 12 wherein the ethylenically unsaturated comonomer is selected from styrene, (meth)acrylic acid, (meth) acrylamides and (meth)acrylates.

16. The photoimageable resin composition of claim 12 wherein the non-brominated low molecular weight copolymer binder (b) comprises the reaction product of n-butyl amine with a copolymer of styrene, butyl meth-acrylate, butyl acrylate and itaconic acid anhydride.

17. The photoimageable resin composition of claim 12 wherein the non-brominated low molecular weight copolymer binder (b) has a weight average molecular weight ($M_w$) ranging from 3,000 to 6,000.

18. The photoimageable resin composition of claim 1 wherein the acrylated urethane monomeric component (c) is a urethane diacrylate comprising the reaction product of 2,6-toluene diisocyanate with a polyol with the end isocyanate groups end-capped with hydroxyethyl acrylate.

19. The photoimageable resin composition of claim 1 wherein the acrylated urethane monomeric component (c) is a brominated urethane diacrylate selected from the reaction product of dibromoneopentyl glycol with hexamethylene diisocyanate and end-capped with hydroxyethyl acrylate; the reaction product of bis(2-hydroxyethylether) of tetrabromobisphenol-A with hexamethylene diisocyanate and end-capped with hydroxyethyl acrylate; and the reaction product of dibromoneopentyl glycol and polyols with aliphatic or aromatic diisocyanates and end-capped with hydroxyethyl acrylate.

20. The photoimageable resin composition of claim 1 wherein the brominated acrylated monomer (d) contains at least one (meth)acryloyloxy group.

21. The photoimageable resin composition of claim 20 wherein the brominated acrylated monomer (d) is selected from bis-(3-methacryloyloxy-2-hydroxypropyl) ether of tetrabromobisphenol-A, bis3-acryloyloxy-2-hydroxypropyl) ether of tetrabromobis-phenol-A, bis-(2-methacryloyloxyethyl) ether of tetrabromobisphenol-A, bis-(2-acryloyloxyethyl) ether of tetrabromobisphenol-A, 2-tribromophenoxyethyl methacrylate, 2-(2-tribromophenoxyethoxy) ethyl acrylate, tribromophenyl acrylate, pentabromobenzyl acrylate, pentabromobenzyl methacrylate, tribromoneo-pentyl acrylate, and the reaction products of diepoxy oligomers of tetrabromobisphenol-A and epichlorohydrin with acrylic acid or methacrylic acid which are further reacted with succinic anhydride.

22. The photoimageable resin composition of claim 1 wherein the brominated additive (e) is selected from mixed esters of 3,4,5,6-tetrabromo-1,2-benzene dicarboxylic acid with diethylene glycol and a glycol selected from propylene glycol and ethylene glycol; bis-(2-hydroxyethyl) ether of tetrabromobisphenol-A; 2,2-bis-(bromomethyl)-3-bromo-1-propanol; 2,2-bis(bromomethyl)-1,3-propanediol; di-(tribromophenolate) of tetrabromobisphenol-A diglycidyl ether and succinic esters thereof; tetrabromobisphenol-A; brominated poly(p-vinylphenol); and poly(dibromophenylene oxide).

23. The photoimageable resin composition of claim 1 wherein the brominated additive (e) is selected from di-2-ethylhexyl tetrabromophthalate and tris-(dibromophenyl) phosphate.

24. The photoimageable resin composition of claim 1 wherein the brominated additive (e) comprises a flame-retardant, brominated filler compound.

25. The photoimageable resin composition of claim 24 wherein the flame-retardant, brominated filler compound is selected from ethylene bis-(tetrabromophthalimide), deca-bromodiphenyl oxide, bis-(tribromophenoxy) ethane and poly(pentabromobenzyl) acrylate.

26. The photoimageable resin composition of claim 1 wherein the blocked polyisocyanate crosslinking agent (g) is selected from aliphatic, cycloaliphatic, aromatic and arylaliphatic di, tri and tetraisocyanates, wherein the isocyanate groups are blocked by a compound selected from betacarbonyls, hydroxamates, triazoles, imidazoles, tetrahydropymmidines, lactams, ketoximes, oximes, low molecular weight alcohols, phenols, and thiophenols.

27. The photoimageable resin composition of claim 26 wherein the blocked polyisocyanate crosslinking agent (g) is selected from the trimer of 1,6-diisocyanatohexane blocked with methylethyl ketoxime; isophorone diisocyanate blocked with methyl ethyl ketoxime; and the reaction products of 1,6-diisocyanatohexane or trimer thereof with bis-(2-hydroxyethyl-ether) of tetrabromobisphenol-A blocked with methyl ethyl ketoxime.

28. The photoimageable resin composition of claim 1 comprising (a) from 25 to 45% by weight of a brominated carboxylic copolymer derived from the reaction of dibromostyrene, ethyl acrylate and acrylic acid and having a weight average molecular weight ($M_w$) of from 40,000 to 500,000 and containing from 5 to 30% bromine by weight; (b) from 3 to 10% by weight of a non-brominated copolymer binder comprising a copolymer of itaconic anhydride, itaconic acid, butyl acrylate, butyl methacrylate and styrene reacted with n-butylamine having a $M_w$ of 4,000; (c) from 8 to 20% by weight of a urethane diacrylate derived from the reaction of 2,6-toluene diisocyanate and a polyol and end-capped with hydroxyethyl acrylate; (d) from 10 to 30% by weight of a brominated diacrylate derived from the reaction of tetrabromobisphenol-A diglycidyl ether with acrylic acid and containing from 10 to 80% bromine by weight; (e) from 2 to 20% by weight of a reactive mixed diester of 3,4,5, 6tetrabromo-1,2-benzene dicarboxylic acid with diethylene glycol and propylene glycol containing from 10 to 85% bromine by weight; (1) from 0.01 to 5% by weight of a photoinitiator system; and (g) from 5 to 15% by weight of a methyl ethyl ketoxime blocked 1,6-diisocyanato-hexane trimer thermal crosslinking agent.

29. A flexible, flame-retardant, aqueous developable multilayer, photoimageable permanent coating element capable of adhering to a printed circuit board and withstanding molten solder after cure, comprising:
    (1) a temporary support film;
    (2) a first layer of a photoimageable permanent coating composition comprising:
        (a') an amphoteric binder;
        (b') a carboxyl group containing copolymer binder of the formula

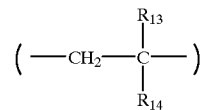

wherein $R_{13}$ is H or $C_{1-4}$ alkyl; $R_{14}$ is phenyl or —$CO_2R_{15}$; and $R_{15}$ is H or $C_{1-4}$ alkyl which can be substituted with one or more hydroxy groups;
        (c') a monomer component containing at least two ethylenically unsaturated groups; and
        (d') a photoinitiator or photoinitiator system;
    (3) a second layer of a photoimageable permanent coating composition comprising:
        (a) a brominated carboxylic copolymer binder formed from (i) a ring-brominated aromatic monomer, (ii) at least one of an alkyl acrylate, alkyl methacrylate or a non-brominated aromatic monomer, wherein alkyl contains from 1 to 20 carbon atoms, and (iii) an ethylenically unsaturated carboxylic acid monomer, said binder having a weight average molecular weight ($M_W$) of from 40,000 to 500,000 and containing from 3 to 40% bromine by weight;

(b) a non-brominated low molecular weight copolymer binder having a weight average molecular weight ($M_W$) of from 2,000 to 10,000, which is the reaction product of a primary amine with a copolymer formed from at least one ethylenically unsaturated dicarboxylic acid anhydride and at least one ethylenically unsaturated comonomer and containing at least one structural unit A and at least one additional structural unit selected from $B_1$, $B_2$, and mixtures thereof containing carboxyl groups, wherein:
(i) 5 to 50 percent by weight of said low molecular weight copolymer binder is formed from at least one structural unit $B_1$, $B_2$ or combination thereof containing carboxyl groups;
(ii) 50 to 95 percent by weight of said low molecular weight copolymer binder is formed from structural unit A, wherein A is different from structural units $B_1$ and $B_2$, and
(iii) A, $B_1$ and $B_2$ have the structures:

A.

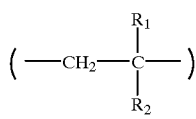

$B_1$.

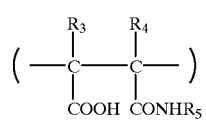

$B_2$.

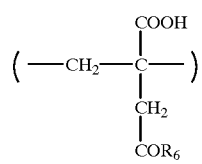

wherein $R_1$ is H, alkyl or aryl; $R_2$ is H, $CH_3$, aryl, —$COOR_7$, $CONR_8R_9$ or —CN; $R_3$ and $R_4$ independently are H or alkyl; $R_5$ is alkyl, aryl or aryl which is substituted with primary amino, secondary amino, tertiary amino, hydroxy or ether groups or mixtures thereof; $R_6$ is —OH or $NHR_5$; and $R_7$, $R_8$ and $R_9$ independently are H, alkyl, aryl or aryl substituted with one or more hydroxy, ester, keto, ether or thioether groups; wherein alkyl in any of the above R groups contains from 1 to 6 carbon atoms;
(c) an acrylated urethane monomeric component containing from 0 to 20% bromine by weight;
(d) a brominated acrylated monomer containing from 10 to 80% bromine by weight with the proviso that (d) is not a urethane monomeric component;
(e) a brominated additive containing from 10 to 85% bromine by weight with the proviso that (e) is not an acrylated monomeric component or a blocked polyisocyanate crosslinking agent;
(f) a photoinitiator or a photoinitiator system; and
(g) a blocked polyisocyanate crosslinking agent containing from 0 to 30% bromine by weight, wherein the total content of bromine in the second layer composition is in a range from 5 to 50% by weight, and further wherein when the composition is applied to a substrate with circuit lines, cured at a temperature greater than 100° C. for one hour, the cured composition is capable of being bent and creased at an angle 900 to the circuit lines without the formation of cracks or delaminations.

30. The multilayer, photoimageable coating element of claim 29 wherein the first layer of photoimageable coating (2) is interposed between the temporary support film (1) and the second layer of photoimageable coating (3).

31. The multilayer, photoimageable coating element of claim 30 firer comprising a temporary support film on the surface of the second layer of photoimageable coating (3).

32. The multilayer, photoimageable coating element of claim 31 wherein the first layer of photoimageable coating (2) releases from the temporary support film (1) before the second layer of photoimageable coating (3) releases from the adjacent-temporary support film.

33. The multilayer, photoimageable coating element of claim 29 wherein the second layer of photoimageable coating (3) is interposed between the temporary support film (1) and the first layer of photoimageable coating (2).

34. The multilayer, photoimageable coating element of claim 33 further comprising a removable cover film on the surface of the first layer of photoimageable coating (2).

35. The multilayer, photoimageable coating element of claim 34 wherein the first layer of photoimageable coating (2) releases from the removable cover film before the second layer of photoimageable coating (3) releases from the temporary support film (1).

36. The multilayer, photoimageable coating element of claim 34 wherein the removable cover film is selected from polyester, silicone treated polyester, polyethylene and polypropylene.

37. The multilayer, photoimageable coating element of claim 36 wherein at least one surface of the removable cover film has a matte or an embossed finish.

38. The multilayer, photoimageable coating element of claim 37 wherein the removable cover film contains inorganic filler particles.

39. The multilayer, photoimageable coating element of claim 29 wherein the temporary support film (1) is selected from polyamides, polyolefins, polyesters, vinyl polymers and cellulose esters.

40. The multilayer, photoimageable coating element of claim 39 wherein the temporary support film (1) is polyethylene terephthalate having a thickness of from 6 to 200 microns.

41. The multilayer, photoimageable coating element of claim 39 wherein at least one surface of the temporary support film (1) has a matte or an embossed finish.

42. The multilayer, photoimageable coating element of claim 41 wherein the temporary support film (1) contains inorganic filler particles.

43. The multilayer, photoimageable coating element of claim 29 wherein the composition of the fist layer of photoimageable permanent coating comprises (a') from 5 to 25% by weight of amphoteric binder; (b') from 30 to 80% by weight of carboxylic copolymer binder; (c') from 5 to 30% by weight of an ethylenically unsaturated monomer; and (d') from 0.50 to 10% by weight of a photoinitiator or photoinitiator system.

44. The multilayer, photoimageable coating element of claim 43 wherein the amphoteric binder comprises a copolymer derived from the copolymerization of (i) from 30 to 60% by weight of an N—$C_{1-12}$ alkyl acrylamide or methacrylamide or a $C_{1-4}$ alkyl aminoalkyl acrylate or methacrylate; (ii) from 10 to 20% by weight of an acidic comonomer selected from the group consisting of acrylic acid, methacrylic acid, crotonic acid, itaconic acid, maleic acid, fumaric acid and the $C_{1-4}$ alkyl half esters of maleic and fumaric acid; and (iii) from 20 to 55% by weight of a comonomer selected from the group consisting of $C_{1-12}$ alkyl(meth)-acrylates, $C_{2-4}$ hydroxyalkyl(meth)acrylates and hydroxystearyl-(meth)acrylates, based on the total weight of the copolymer.

45. The multilayer, photoimageable coating element of claim 44 wherein the amphoteric binder comprises a copolymer of from 35 to 45% by weight of N-tertiary octyl acrylamide, from 12 to 18% by weight of acrylic or methacrylic acid, from 32 to 38% by weight of methyl methacrylate, from 2 to 10% by weight of hydroxypropyl acrylate and from 2 to 10% by weight of $C_{1-4}$ alkyl aminoalkyl(meth)-acrylate, based on the total weight of the copolymer.

46. The multilayer, photoimageable coating element of claim 43 wherein the ethylenically unsaturated monomer component is selected from hexamethylene glycol diacrylate, triethylene glycol diacrylate, tripropylene glycol diacrylate, pentaerythritol triacrylate, trimethylolpropane triacrylate, polyoxyethylated trimethylolpropane triacrylate, pentaerythritol triacrylate, pentaerythritol tetracrylate, bisphenol A diacrylate, di-(3-acryloxy-2-hydroxypropyl) ether of bisphenol-A, di(3-acryloxy-2-hydroxypropyl) ether of tetrabromobisphenol-A, aliphatic urethane diacrylate and aromatic urethane diacrylate.

47. The multilayer, photoimageable coating element of claim 29 wherein the composition of the second layer of photoimageable permanent coating comprises, based on the total weight of the composition, from 10 to 60% by weight of the brominated carboxylic copolymer binder (a); from 2 to 15% by weight of the non-brominated copolymer binder (b); from 5 to 30% by weight of the acrylated urethane monomeric component (c); from 5 to 40% by weight of the brominated acrylated monomer (d); from 1 to 40% by weight of the brominated additive (e); from 0.01 to 10% by weight of the photoinitiator system (f); and from 2 to 20% by weight of the blocked polyisocyanate crosslinking agent (g).

48. The multilayer, photoimageable coating element of claim 47 wherein the composition of the second layer of photoimageable permanent coating comprises (a) from 25 to 45% by weight of a brominated carboxylic copolymer derived from the reaction of dibromostyrene, ethyl acrylate and acrylic acid and having a weight average molecular weight ($M_W$) of from 40,000 to 500,000 and containing from 5 to 30% bromine by weight; (b) from 3 to 10% by weight of a non-brominated copolymer binder comprising a copolymer of itaconic anhydride, itaconic acid, butyl acrylate, butyl methacrylate and styrene reacted with n-butylamine having a $M_W$ of 4,000; (c) from 8 to 20% by weight of a urethane diacrylate derived from the reaction of 2,6-toluene diisocyanate and a polyol and end-capped with hydroxyethyl acrylate; (d) from 10 to 30% by weight of a brominated diacrylate derived from the reaction of tetrabromobisphenol-A diglycidyl ether with acrylic acid and containing from 10 to 80% bromine by weight; (e) from 2 to 20% by weight of a reactive mixed ester of 3,4,5,6-tetrabromo-1,2-benzene dicarboxylic acid with diethylene glycol and propylene glycol containing from 10 to 85% bromine by weight; (f) from 0.01 to 5% by weight of a photoinitiator system; and (g) from 5 to 15% by weight of a methyl ethyl ketoxime blocked 1,6-diisocyanato-hexane trimer thermal crosslinking agent.

* * * * *

UNITED STATES PATENT AND TRADEMARK OFFICE
CERTIFICATE OF CORRECTION

PATENT NO.     : 6,218,074 B1                                              Page 1 of 1
DATED          : April 17, 2001
INVENTOR(S)    : Thomas E. Dueber, Yueh-Ling Lee and Frank L. Schadt, III It is certified that error appears in the above-identified patent and that said Letters Patent is hereby corrected as shown below:

Column 35,
Line 24, delete "al" and substitute -- alkyl -- therefor.

Column 36,
Line 9, delete "ii".
Line 33, delete "n-methylheptyl" and substitute -- 1-methylheptyl -- therefor.
Line 49, delete "fumuaric" and substititue -- fumaric -- therefor.

Column 37,
Line 36, delete "bis3-acryloyloxy-2-hydroxypropyl) and substitute -- bis-(3-acryloyloxy-2-hydroxypropyl -- therefor.
Line 48, delete "broniinated" and substitute -- brominated -- therefor.

Column 38,
Line 9, delete "tetrahydropymmidines" and substitute -- tetrahydropyrimidines -- therefor.
Line 34, delete "6tetrabromo-1,2-benzene" and substitute -- 6-tetrabromo-1,2-benzene -- therefor.
Line 38, delete "(1)" and substitute -- (f) -- therefor.

Column 40,
Line 7, delete "900" and substitute -- 90º -- therefor.
Line 58, delete "fist" and substitute -- first -- therefor.

Signed and Sealed this

Seventeenth Day of December, 2002

JAMES E. ROGAN
*Director of the United States Patent and Trademark Office*